United States Patent [19]

Tsutsumi

[11] Patent Number: 5,789,792
[45] Date of Patent: Aug. 4, 1998

[54] ISOLATION TRENCH STRUCTURES PROTRUDING ABOVE A SUBSTRATE SURFACE

[75] Inventor: Toshiaki Tsutsumi, Hyogo, Japan

[73] Assignee: Mitsubishi Denki Kabushiki Kaisha, Tokyo, Japan

[21] Appl. No.: 788,732

[22] Filed: Jan. 23, 1997

[30] Foreign Application Priority Data

Aug. 28, 1996 [JP] Japan ................................ 8-226356

[51] Int. Cl.$^6$ ........................ H01L 29/41; H01L 21/762
[52] U.S. Cl. ...................... 257/506; 257/499; 257/501; 257/510; 257/374; 438/221; 438/224
[58] Field of Search ........................ 257/506, 508, 257/511, 500, 501, 374; 438/218–228

[56] References Cited

U.S. PATENT DOCUMENTS

| | | | |
|---|---|---|---|
| 4,506,434 | 3/1985 | Ogawa et al. | 257/374 |
| 4,593,459 | 6/1986 | Poppert et al. | 257/374 |
| 4,908,688 | 3/1990 | Lund et al. | 257/506 |
| 4,945,070 | 7/1990 | Hsu | 437/160 |
| 4,980,306 | 12/1990 | Shimbo | 437/34 |
| 5,319,235 | 6/1994 | Kihara et al. | 257/506 |

FOREIGN PATENT DOCUMENTS

| | | | |
|---|---|---|---|
| 61-164256 | 7/1986 | Japan | 257/510 |
| 7-094733 | 4/1995 | Japan . | |
| 7-183369 | 7/1995 | Japan . | |

OTHER PUBLICATIONS

IBM Technical Disclosure Bulletin, vol. 28, No. 7, Dec. 1985, pp. 2828–2829.
K. Shibahara et al, "Trench Isolation With ∇(Nabla)–Shaped Buried Oxide for 256Mega–Bit Drams, "International Electron Device Meeting 1992, pp. 275–278.
T. Nakabayashi et al, "A Novel 0.25μm Cmos Technology for 6.28μm$^2$ -Tr. Sram Cell With Elevated Trench Isolation and Line–and–Space Shaped Gates (Etils)."International Electron Device Meeting 1995, pp. 1011–1013.

*Primary Examiner*—Tom Thomas
*Assistant Examiner*—David B. Hardy
*Attorney, Agent, or Firm*—McDermott, Will & Emery

[57] ABSTRACT

A structure includes an element isolating region for isolating a transistor formation region having an MOS transistor from other element formation region. Two or more trenches is formed at a semiconductor substrate in the element isolation region. An isolating and insulating layer filling the trench and protruded above the main surface of the semiconductor substrate has a side surface continuous with a side surface of the trench. Insulating layers and layered on the surface of the semiconductor substrate is located between the trenches. The insulating layer has the upper surface at the substantially same level as the upper surface of an isolating and insulating layer. This structure suppresses increase in a parasitic capacitance of a gate electrode, and allows a fast operation without difficulty.

9 Claims, 28 Drawing Sheets

ISOLATION TRENCH STRUCTURES PROTRUDING ABOVE A SUBSTRATE SURFACE

BACKGROUND OF THE INVENTION

1. Field of the Invention

The present invention relates to a semiconductor device and a method of manufacturing the same, and in particular relates to a semiconductor device having an element isolating region for electrically isolating mutually neighboring element formation regions from each other as well as a method of manufacturing the same.

2. Description of the Background Art

For example, a DRAM (Dynamic Random Access Memory) is provided with a memory cell array 100a and a peripheral circuit region including, e.g., a column or row decoder 100b in FIG. 41. An element isolating region 100c is arranged between memory cell array 100a and peripheral circuit region (e.g., decoder 100b) for electrically isolating them from each other. This element isolating region 100c requires a predetermined width $W_2$ in view of arrangement of interconnections between the memory cell array and elements such as decoders.

In element isolating region 100c in the prior art, there is arranged an element isolating oxide film, which is formed by an LOCOS (Local Oxidation of Silicon) method, for electrically isolating the regions from each other. However, a bird's beak is formed at such an element isolating oxide film and thus increases sizes of the element isolating region, which impedes reduction in size of the device. Accordingly, a trench isolation has been employed as an isolating method which does not cause a problem of a bird's beak and therefore allows easy reduction in sizes of the device. This trench isolation is provided by filling a trench with an insulating layer. Description will now be given on a semiconductor device having the trench isolation in the prior art.

FIG. 42 is a cross section schematically showing a structure of a semiconductor device having a trench isolation in the prior art. FIG. 43 is a schematic cross section taken along line 43—43 in FIG. 42.

Referring to FIGS. 42 and 43, semiconductor substrate 1 is provided with transistor formation regions and element isolating regions for electrically isolating the transistor formation regions from other regions. In FIG. 42, regions located around the transistor formation region form the element isolating regions.

In the transistor formation region, an MOS (Metal Oxide Semiconductor) transistor 10 is formed at the main surface of semiconductor substrate 1. MOS transistor 10 has a pair of source/drain regions 3, a gate insulating layer 5 and a gate electrode 7. Paired source/drain regions 3 are formed at the main surface of semiconductor substrate 1 and are spaced from each other. Gate electrode layer 7 is formed on the region, which is located between paired source/drain regions 3, with the gate insulating layer 5 therebetween. Gate electrode layer 7 extends in a predetermined direction to a position above the element isolating region for electrical connection to another element.

The element isolating region at the right in the figure of the transistor formation region is provided with a trench 1c. Trench 1c has a width $W_2$ larger than, e.g., 10 µm. There is formed an isolating and insulating layer 15 filling trench 1c.

The element isolating region at the left in the figure of the transistor formation region is provided with trench isolation formed by filling each trench 1b with insulating layer 15.

A method of manufacturing a semiconductor device having a conventional trench isolation will be described below.

FIGS. 44 to 49 are schematic cross sections showing, in the order of steps, the method of manufacturing the semiconductor device having the conventional trench isolation. Referring first to FIG. 44, an insulating layer 11 made of a silicon oxide film is formed on semiconductor substrate 1, and a silicon nitride film 113 of 200 nm in thickness is formed on the insulating layer 11 by a CVD (Chemical Vapor Deposition) method. A resist pattern 133 is formed on silicon nitride film 113 by photolithography. Using this resist pattern 133 as a mask, dry etching is effected to pattern silicon nitride film 113 and insulating layer 11.

This exposes the main surface of semiconductor substrate 1 at regions surrounding the element isolating region and the transistor formation region. Thereafter, etching is effected on the exposed main surface of semiconductor substrate 1 which is stilled masked with resist pattern 133. Thereafter, resist pattern 133 is removed.

Referring to FIG. 45, the above etching forms trenches 1b and 1c of 200 to 400 nm in depth at the main surface of semiconductor substrate 1.

Referring to FIG. 46, a CVD method is performed to form isolating and insulating layer 15 of 500 nm in thickness, which fills trenches 1b and 1c, covers silicon nitride film 113 and is made of a silicon oxide film. Thereafter, etching is effected by a polishing method on isolating and insulating layer 15 to expose at least the surface of silicon nitride film 113.

Referring to FIG. 47, this etching exposes the surface of silicon nitride film 113 and leaves isolating and insulating layers 15 filling trenches 1b and 1c. Thereafter, isolating and insulating layer 15 is further etched slightly.

Referring to FIG. 48, this etching reduces the thickness of isolating and insulating layer 15, and thereafter silicon nitride film 113 is removed by thermal phosphoric acid, and insulating layer 11 is removed.

Referring to FIG. 49, the trench isolation in which trenches 1b and 1c are filled with isolating and insulating layers 15 is completed in this manner.

Thereafter, a thermal oxidation method or a CVD method is performed to form gate insulating layer 5. Thereafter, a CVD method is performed to form an electrically conductive film of 300 nm in thickness made of polycrystalline silicon or metal silicide such as a titanium silicide, and is patterned by photolithography or etching. Thereby, gate electrode layer 7 is formed, and then the source/drain regions are formed by ion implantation and others, so that the semiconductor device shown in FIGS. 42 and 43 is completed.

According to the conventional manufacturing method described above, isolating and insulating layer 15 is polished, e.g., by a CMP (Chemical Mechanical Polishing) method in the steps shown in FIGS. 46 and 47. This polishing is performed in a chemical mechanical manner with a polishing pad pressed against a wafer surface. This polishing pad may be bent or curved during polishing. Therefore, if the width $W_2$ of trench 1c shown in FIG. 42 is larger than 10 µm, the curved polishing pad forms a dished surface at the isolating and insulating layer 15.

The dished surface of isolating and insulating layer 15 causes a difference in level at the surface, and impairs the flatness, so that the following problems may arise.

(1) Together with an increased NA of lenses, the level difference makes it difficult to ensure an intended focal depth.

(2) The level difference may cause halation, which impedes precise pattern formation.

(3) In a step of patterning the gate electrode layer, residue of the gate electrode layer which is not removed causes a short circuit between the gate electrode layers.

Since the isolating and insulating layer 15 has the dish surface as shown in FIG. 42, isolating and insulating layer 15 locally has an extremely small thickness of $T_4$. In this case, a large parasitic capacitance is unpreferably generated between gate electrode layer 7 and semiconductor substrate 1.

As measures for preventing this level difference at isolating and insulating layer 15, a structure shown in FIG. 50 may be employed.

Referring to FIG. 50, a section corresponding to that in FIG. 42 is shown in this figure. A section taken along line 51—51 FIG. 50 corresponds to the section shown in FIG. 43. An element isolating region at the right of a transistor formation region in the figure is provided with a plurality of divided trenches 1a each having a width $W_3$ of 10 µm or less. Trench 1a of width $W_3$ of 10 µm or less makes it possible to prevent dishing of the surface due to polishing of isolating and insulating layer 15, and therefore a substantially flat surface can be formed. Thereby, the foregoing problems (1)–(3) can be overcome.

In this case, however, only gate insulating layer 5 is present between gate electrode layer 7 and semiconductor substrate 1. Gate insulating layer 5 has a small thickness from 50 to 100 Å in view of characteristics of the MOS transistor. Therefore, the problem relating to a large parasitic capacitance cannot be overcome, and more specifically, a large parasitic capacitance occurs between gate electrode layer 7 and semiconductor substrate 1 at a region $R_3$ in element isolating region where gate electrode layer 7 and semiconductor substrate 1 are opposed to each other.

The structure shown in FIG. 50 also suffers from such a problem that a so-called reverse narrow channel effect may impede a fast operation. This will be described below in detail.

FIG. 51 is a schematic cross section showing, on an enlarged scale, the transistor formation region in FIG. 50. Referring to FIG. 51, when a voltage is applied to gate electrode layer 7, a channel 4a is formed at the main surface of semiconductor substrate 1 by inversion, and a current flows between source/drain regions 3. At a region $R_4$ in this structure, isolating and insulating layer 15 located between gate electrode layer 7 and semiconductor substrate 1 is relatively thin. In addition to channel 4a, therefore, a channel 4b is formed at a position deeper than channel 4a and extends along the side surface of trench 1b.

The region including channel 4b is doped with impurity, which is generally smaller in quantity than that at a region including the channel 4a. Therefore, the inverted voltage at channel 4b is higher than that at channel 4a.

As shown in FIG. 52, when a voltage $V_G$ applied to the gate electrode, i.e., gate voltage is lower than voltage $V_1$, only channel region 4a acts to flow a current between source/drain regions. However, when gate voltage $V_G$ increases to or above voltage $V_1$, channel 4b is formed by inversion, so that channels 4a and 4b act to flow a current between source/drain regions. Therefore, when gate voltage $V_G$ reaches voltage $V_1$, drain current $I_D$ rapidly rises. When the drain current rapidly rises, a waveform of a pulse is disturbed at a rising portion, which impedes a fast operation.

SUMMARY OF THE INVENTION

An object of the invention is to provide a semiconductor device which can suppress increase in parasitic capacitance of a gate electrode and can easily allow a fast operation as well as a method of manufacturing the same.

The present invention provides a semiconductor device having an element isolating region for electrically isolating mutually neighboring element formation regions from each other, and including a semiconductor substrate, a first insulating layer, a second insulating layer and a conductive layer. The semiconductor substrate has a main surface and is provided at the main surface within the element isolating region with a plurality of trenches. The first insulating layer fills the trench and has a portion protruded above the main surface. The portion of the first insulating layer protruded above the main surface has a side surface substantially continuous with a side surface of the trench. The second insulating layer is formed entirely on the main surface located between the plurality of trenches, and is made of a material different from that of the first insulating layer. The conductive layer is electrically connected to an element in the element formation region, has a portion located in the element formation region and formed on the main surface with a third insulating layer therebetween, and has a portion located in the element isolating region and extending over upper surfaces of the first and second insulating layers. The second insulating layer has a thickness larger than that of the third insulating layer.

According to the semiconductor device of the invention, the second insulating layer at the element isolating region has a thickness larger than that of the third insulating layer at the element formation region. Therefore, the insulating layer located between the conductive layer and the semiconductor substrate has the thickness at the element isolating region which is larger than that at the element formation region. Accordingly, the parasitic capacitance between the conductive layer and the semiconductor substrate at the element isolating region can be smaller than that in the prior art.

The first insulating layer filling the trench at the element isolating region has the portion, which is protruded above the main surface and has the side surface substantially continuous with the side surface of the trench. Therefore, as compared with the prior art in which an insulating layer merely fills a trench, a larger space can be ensured between the conductive layer located on the first insulating layer and the semiconductor substrate. In the structure where the conductive layer forms the gate electrode, therefore, a channel can be formed only at the surface region of the element formation region. Accordingly, the drain current does not rapidly increase, and propagation of a pulse is not disturbed at a rising portion, so that a rapid operation is allowed.

Since the element isolating region is provided with the plurality of divided trenches, a width of each trench can be set to an appropriate value. Therefore, it is possible to prevent dishing of the upper surface of the insulating layer filling the trench during polishing, which may be caused by an excessively wide trench. Accordingly, a level difference due to dishing does not occur, so that accurate patterning can be performed even above the trench.

Preferably, in the above aspect, the upper surface of the first insulating layer is at the substantially same level as the upper surface of the second insulating layer from the main surface.

Since the first and second insulating layers have the upper surfaces at the substantially same levels, this structure allows easy patterning of the conductive layer and others on the first and second insulating layers.

Preferably, in the above aspect, the upper surface of the conductive layer in the element formation region is located at a first level from the main surface, and the upper surfaces of the first and second insulating layers are located at a second level not higher than the first level.

Preferably, in the above aspect, the second insulating layer has a thickness from 2000 Å to 8000 Å.

If the second insulating layer has a film thickness smaller than 2000 Å, it is difficult to reduce a parasitic capacitance between the conductive layer and the semiconductor substrate. If the second insulating layer has a thickness larger than 8000 Å, it is difficult to perform intended patterning of the conductive layer.

Preferably, in the above aspect, the first insulating layer is a silicon oxide film not substantially containing impurity, and the second insulating layer is a silicon oxide film containing at least either of boron or phosphorus.

Preferably, in the above aspect, the first insulating layer is a silicon oxide film, and the second insulating layer is a silicon nitride film.

Preferably, in the above aspect, the trench extends with its width kept in a range from 0.1 μm to 10 μm.

If the trench width exceeds 10 μm, the upper surface of the first insulating layer filling the trench is dishd during polishing, which impedes patterning of the conductive layer and others at the dish portion thus formed. If the trench width is smaller than 0.1 μm, it is difficult to achieve an effect of electrical isolation.

Preferably, in the above aspect, the conductive layer is a gate electrode layer of an insulated gate field effect transistor, and the third insulating layer is a gate insulating layer.

Preferably, in the above aspect, the element formation region having the insulated gate field effect transistor is surrounded by the element isolating region.

The invention also provides methods of manufacturing semiconductor devices, each of which basically has an element isolating region for electrically isolating mutually neighboring element formation regions from each other, and the methods have the following features.

A method of manufacturing a semiconductor device according to an aspect of the invention includes the following steps:

First and second insulating layers are successively formed on a main surface of a semiconductor substrate, and thereafter the first and second insulating layers are patterned into predetermined configurations. Etching is effected on the main surface of the semiconductor substrate masked with the patterned first and second insulating layers to form a plurality of trenches in the element isolating region. A step is then performed to form a third insulating layer made of a material different from that of the first insulating layer, filling the trenches and covering the second insulating layer. The third insulating layer is polished and removed to expose at least the upper surface of the second insulating layer and thereby provide the upper surfaces of the second and third insulating layers forming the substantially same plane. The third insulating layer is removed to provide the upper surfaces of the first and third insulating layers forming the substantially same plane. The second insulating layer is removed. Etching is effected under the conditions that suppress easy removal of the third insulating layer and allow easy removal of the first insulating layer, and thereby the first insulating layer in the element formation region is selectively removed. A conductive layer is formed on the main surface of the semiconductor substrate in the element formation region with a fourth insulating layer therebetween.

A method of manufacturing a semiconductor device according to another aspect of the invention includes the following steps:

A first insulating layer is formed on a main surface of a semiconductor substrate, and thereafter the first insulating layer is patterned into a predetermined configuration. Etching is effected on the main surface of the semiconductor substrate masked with the patterned first insulating layer to form a plurality of trenches at the element isolating region. A step is then performed to form a second insulating layer made of a material different from that of the first insulating layer, filling the trenches and covering the first insulating layer. The second insulating layer is polished and removed to expose at least the upper surface of the first insulating layer, and thereby provide the upper surfaces of the first and second insulating layers forming the substantially same plane. Etching is effected under the conditions that suppress easy removal of the second insulating layer and allow easy removal of the first insulating layer, and thereby the first insulating layer in the element formation region is selectively removed. A conductive layer is formed on the main surface of the semiconductor substrate in the element formation region with a third insulating layer therebetween.

A method of manufacturing a semiconductor device according to still another aspect of the invention includes the following steps:

A first conductive layer is formed on a main surface of a semiconductor substrate, and thereafter the first conductive layer is patterned into a predetermined configuration. Etching is effected on the main surface of the semiconductor substrate to form a plurality of trenches at the element isolating region. A step is then performed to form a first insulating layer filling the trenches and covering the first conductive layer. The first insulating layer is polished and removed to expose at least the upper surface of the first conductive layer, and thereby provide the upper surfaces of the first conductive layer and the first insulating layer forming the substantially same plane. The first conductive layer is removed. A step is performed to form a second insulating layer on the main surface, the first and second insulating layers having the upper surfaces forming the substantially same plane. Etching is effected under the conditions that suppress easy removal of the first insulating layer and allow easy removal of the second insulating layer, and thereby the second insulating layer in the element formation region is selectively removed. A second conductive layer is formed on the main surface of the semiconductor substrate in the element formation region with a third insulating layer therebetween.

Preferably, in the above aspect, the method further includes the step of forming a fourth insulating layer on the main surface of the semiconductor substrate. The first conductive layer is formed on the fourth insulating layer. The step of removing the first conductive layer exposes the surface of the fourth insulating layer. The second insulating layer is formed on the exposed fourth insulating layer. After selectively removing the second insulating layer in the element formation region, the fourth insulating layer in the element formation region is removed.

A method of manufacturing a semiconductor device according to yet another aspect of the invention includes the following steps:

A first insulating layer and a conductive layer is formed on a main surface of a semiconductor substrate, and thereafter the conductive layer is patterned into a predetermined configuration. Etching is effected on the main surface of the semiconductor substrate to form a plurality of trenches at the element isolating region. A step is then performed to form a second insulating layer filling the trenches and covering the conductive layer. The second insulating layer is polished and removed to expose at least the upper surface of the conductive layer, and thereby the upper surfaces of the conductive layer and the second insulating layer form the substantially same plane. The conductive layer other than that in the element formation region is removed without removing the conductive layer in the element formation region. A step is performed to form a third insulating layer at the region formerly bearing the conductive layer removed therefrom, and thereby provide the upper surfaces of the third insulating layer and the second insulating layer forming the substantially same plane.

According to the methods of manufacturing the semiconductor devices of the above four aspects, it is possible to manufacture the semiconductor device, which the parasitic capacitance between the conductive layer and the semiconductor substrate is reduced, a fast operation is allowed and precise patterning is allowed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described below with reference to the drawings.

EMBODIMENT 1

Figure 1:
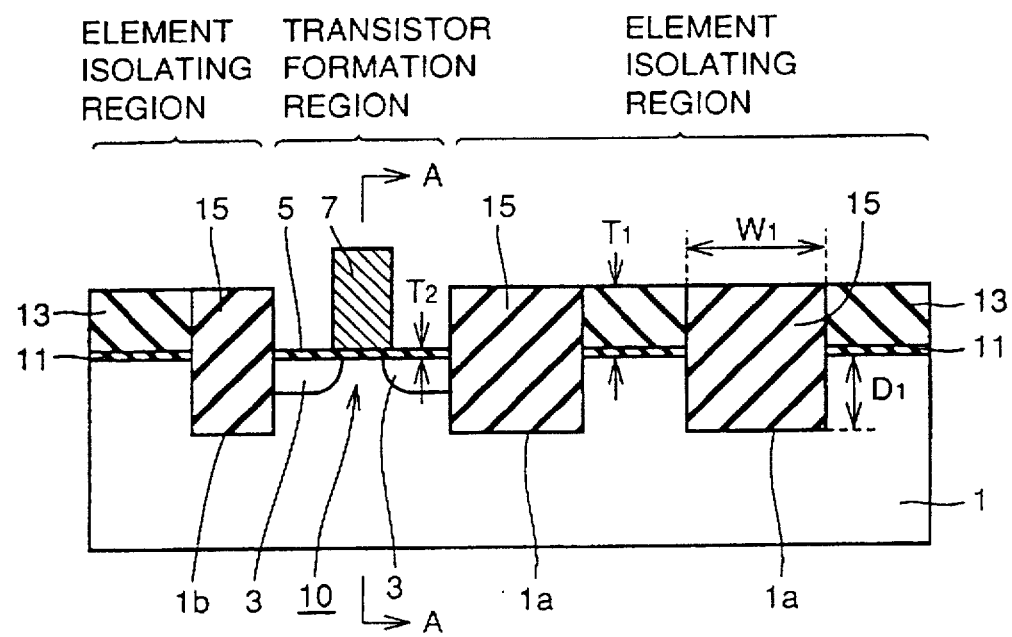
FIG. 1 is a cross section schematically showing a structure of a semiconductor device of an embodiment 1 of the invention.
Figure 2:
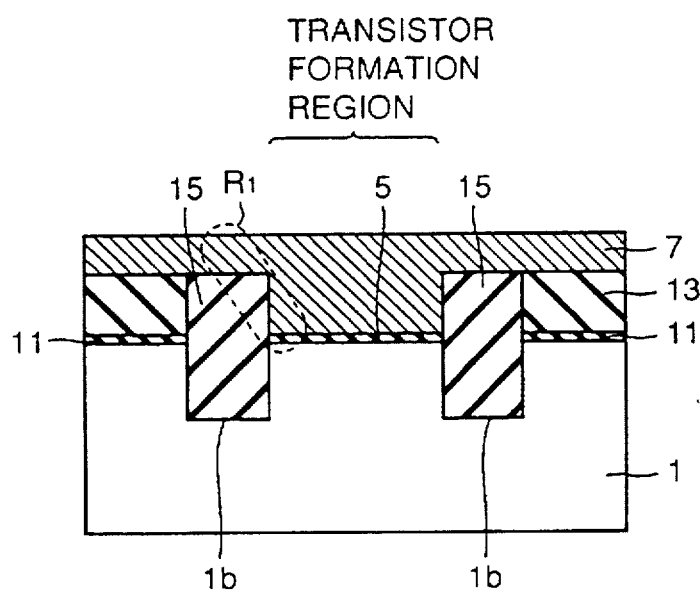
FIG. 2 is a schematic cross section taken along line A—A in FIG. 1.

Referring to FIGS. 1 and 2, a semiconductor device of this embodiment includes transistor formation regions and element isolating regions for electrically isolating transistors from other elements. In FIG. 1, regions located around the transistor formation region form the element isolating regions.

In the transistor formation region, an MOS transistor 10 is formed on a main surface of a semiconductor substrate 1, and has a pair of source/drain regions 3, a gate insulating layer 5 and a gate electrode layer 7. Paired source/drain regions 3 are formed at the main surface of semiconductor substrate 1 and are spaced from each other. Gate electrode layer 7 is formed on the region between paired source/drain regions 3 with gate insulating layer 5 therebetween.

The element isolating region is provided with a trench isolation structure. The trench isolation structure has trenches 1a and 1b and isolating and insulating layers 15.

Two or more trenches 1a are formed at the element isolating region. At least one trench 1b is formed at the element isolating region. Isolating and insulating layers 15 fill trenches 1a and 1b, and are protruded above the main surface of semiconductor substrate 1. Side surfaces of the portions of isolating and insulating layers 15 protruded above the main surface of semiconductor substrate 1 are continuous with the side surfaces of trenches 1a and 1b. On the main surface of semiconductor substrate 1 located between trenches 1a, there are formed insulating layers 11 and 13 which are layered together and are in contact with side surfaces of isolating and insulating layers 15. Insulating layers 11 and 13 are also layered at a position neighboring to isolating and insulating layer 15 filling trench 1b. Insulating layer 13 and isolating and insulating layers 15 have upper surfaces, which are at the same level from the main surface of semiconductor substrate 1 and form the substantially same plane.

In the transistor formation region, the height of upper surface of gate electrode layer 7 from the main surface of semiconductor substrate 1 is larger than the height of upper surfaces of insulating layer 13 and isolating and insulating layer 15 from the main surface of semiconductor substrate 1. Gate electrode layer 7 is formed of a polycrystalline silicon film doped with impurity, and has a thickness of 700 nm.

A sum $T_1$ of thicknesses of insulating layers 11 and 13 is in a range from 2000 Å to 8000 Å. A thickness $T_2$ of gate insulating layer 5 is in a range from 50 Å to 100 Å. Trench 1a has a width $W_1$ in a range from 0.1 μm to 10 μm, and extends in a predetermined direction with this width $W_1$. A region between two trenches 1a and 1b has a width of 10 μm or less. Each of trenches 1a and 1b has a depth D1 in a range from 200 nm to 400 nm.

Insulating layers 5 and 11 are made of silicon oxide films produced, e.g., by a thermal oxidation method or a CVD method. Insulating layer 13 is made of a silicon oxide film (PSG film or BPSG film) containing at least either of phosphorus or boron. Isolating and insulating layer 15 is made of, e.g., a silicon oxide film which is not substantially doped with impurity.

A method of manufacturing the semiconductor device of this embodiment will be described below.

Figure 3:
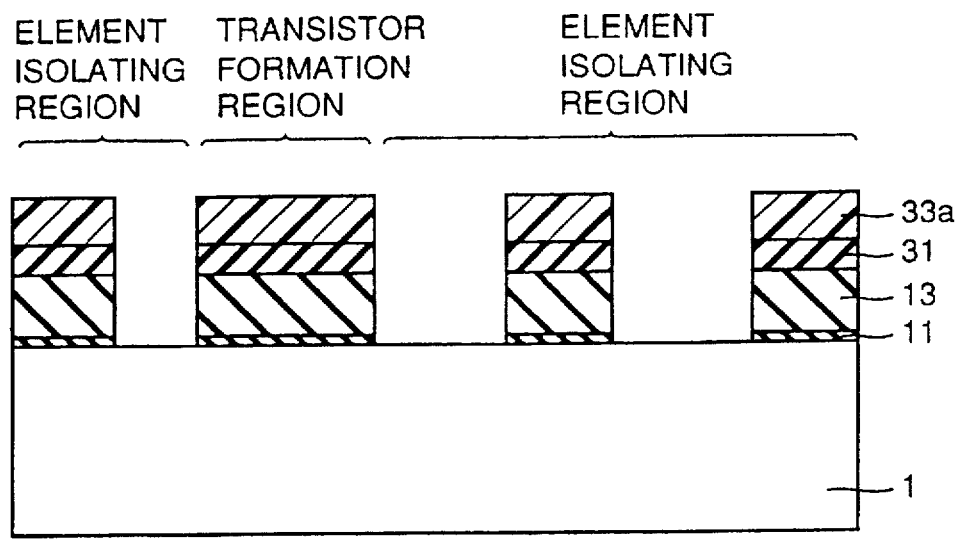
FIGS. 3 to 10 are schematic cross sections showing 1st to 8th steps in a method of manufacturing the semiconductor device of the embodiment 1 of the invention, respectively.

Referring first to FIG. 3, insulating layer 11 of 20 nm in thickness made of, e.g., a silicon oxide film is formed at the main surface of semiconductor substrate 1 by a thermal oxidation method or a CVD method. Insulating layer 13 which is 500 nm in thickness and is made of a silicon oxide film (PSG film or BPSG film) containing at least either of phosphorus or boron is formed on insulating layer 11, e.g., by a CVD method. An insulating layer 31 made of a silicon nitride film of 100 nm in thickness is formed on insulating layer 13, e.g., by a CVD method. A resist pattern 33a having a predetermined configuration is formed on insulating layer 31 by photolithography. Resist pattern 33a defines the transistor formation region, and divides a large element isolating region into a plurality of regions each having a width of 10 μm or less.

Using resist pattern 33a as a mask, a dry etching method is performed for successively etching insulating layers 31, 13 and 11 to expose the main surface of semiconductor substrate 1.

Insulating layer 11 serves to prevent diffusion of impurity such as phosphorus or boron in insulating layer 13 toward semiconductor substrate 1.

Still using resist pattern 33a as a mask, etching is effected on the exposed main surface of semiconductor substrate 1. Thereafter, resist pattern 33a is removed, e.g., by ashing.

Figure 4:
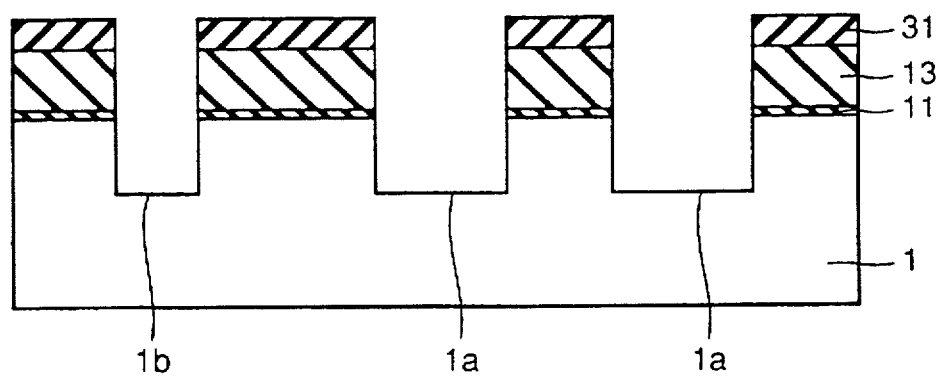

Referring to FIG. 4, etching is effected on semiconductor substrate 1 to form selectively trenches 1a and 1b of depths from 200 nm to 400 nm on the main surface of semiconductor substrate 1.

The etching for forming trenches 1a and 1b is performed without removing resist pattern 33a. However, this etching may be performed using insulating layer 31 as a mask after removing resist pattern 33a.

Figure 5:
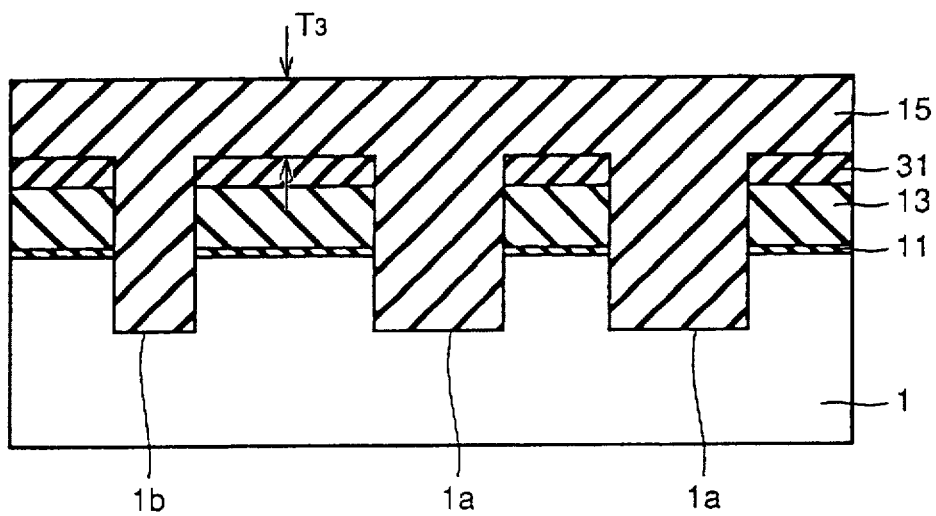

Referring to FIG. 5, a step is performed to form insulating layer 15, which fills trenches 1a and 1b, covers insulating layer 31, and is made of, e.g., a silicon oxide film not substantially containing impurity. Insulating layer 15 thus formed has such a thickness $T_3$ that a sum of the thicknesses of insulating layers 11, 13 and 15 is equal to, e.g., 700 nm. Thereafter, insulating layer 15 is polished and removed by a polishing method such as a CMP method to expose at least the surface of insulating layer 31.

Figure 6:
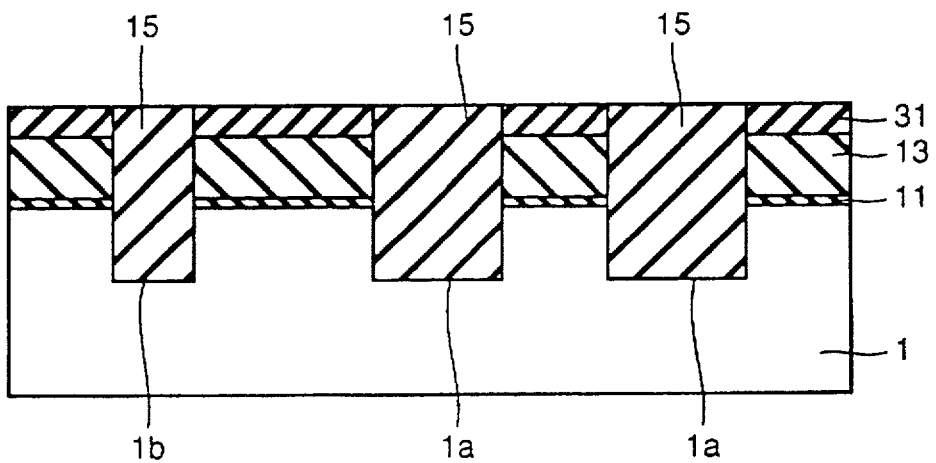

Referring to FIG. 6, this polishing leaves only portions of insulating layer 15 filling trenches 1a and 1b, and the upper surfaces of isolating and insulating layer 15 and insulating layer 31 have the upper surfaces forming the substantially same plane.

In this polishing process, insulating layer 31 serves as a stopper. For example, in such a case that insulating layer 31 is made of, e.g., a silicon nitride film and isolating and insulating layer 15 is made of, e.g., a silicon oxide film, the silicon nitride film is less susceptible to polishing than the silicon oxide film. Therefore, the polishing rate decreases when the surface of insulating layer 31 is exposed, so that end of the polishing can be detected.

If the polished thickness of insulating layer 15 can be sufficiently controlled without the stopper, the insulating layer 31 may be eliminated.

Thereafter, isolating and insulating layer 15 is slightly etched by dry etching or etching with hydrofluoric acid (HF).

Figure 7:
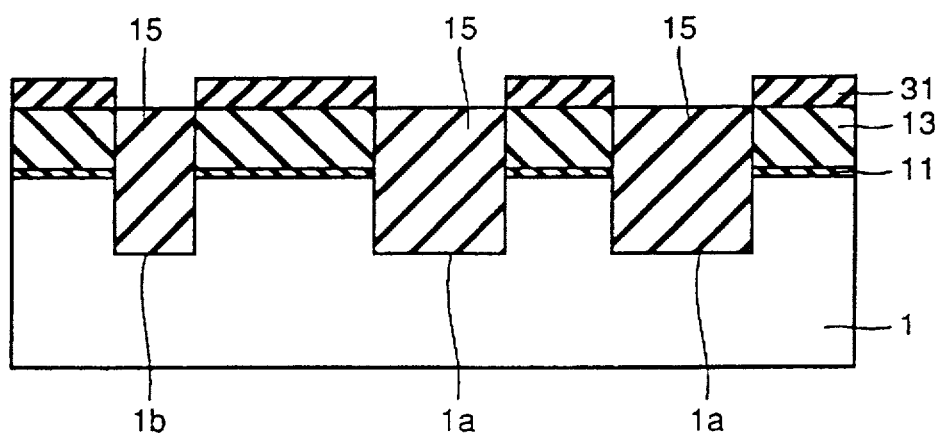

Referring to FIG. 7, this etching reduces the thickness of isolating and insulating layer 15, so that the upper surfaces of the isolating and insulating layer 15 and insulating layer 13 form the substantially same plane. Thereafter, insulating layer 31 is removed with thermal phosphoric acid.

Figure 8:
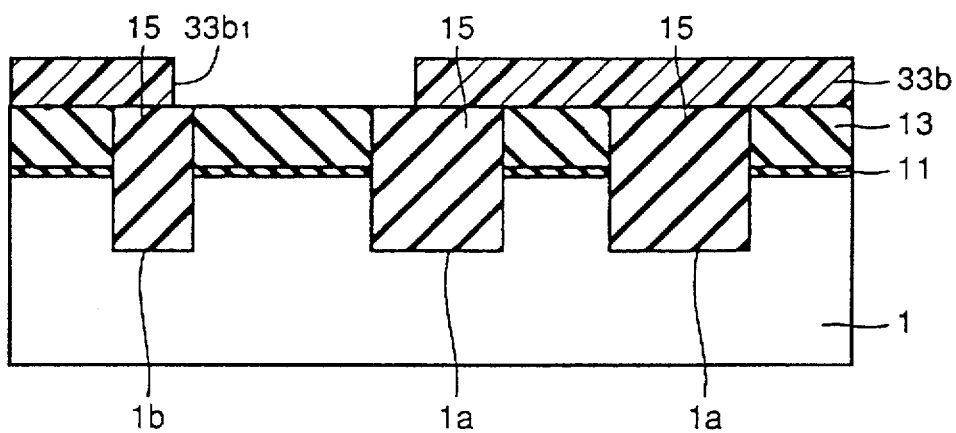

Referring to FIG. 8, the upper surface of insulating layer 13 is exposed because insulating layer 31 is removed. A resist pattern 33b having a hole pattern $33b_1$ is formed by photolithography. Hole pattern $33b_1$ exposes at least the surface of insulating layer 13 at the transistor formation region. A size of the opening in hole pattern $33b_1$ is set in view of the alignment precision of the photolithography, and specifically is set to be larger than the size of the transistor formation region by a size corresponding to an alignment precision.

Using resist pattern 33b as a mask, etching is effected on insulating layer 13 and isolating and insulating layer 15. This etching is performed with HF vapor. Under this condition, isolating and insulating layer 15 is scarcely etched, and only insulating layer 13 is selectively etched. Thereby, thin insulating layer 11 at the transistor formation region is exposed. Thereafter, thin insulating layer 11 is etched and removed with dilute HF solution.

When insulating layer 11 is etched, isolating and insulating layer 15 is etched to a small extent. However, the etched thickness is small, so that this etched state is not shown in the figure.

Figure 9:
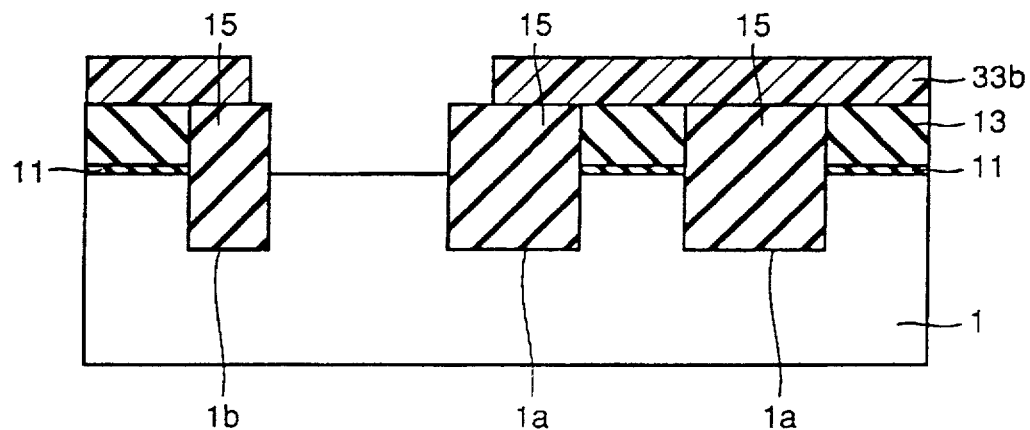

Referring to FIG. 9, the etching of thin insulating layer 11 exposes the main surface of semiconductor substrate 1 at the transistor formation region.

Through the steps described above, the element isolating structure with the trench isolation is completed.

Figure 10:
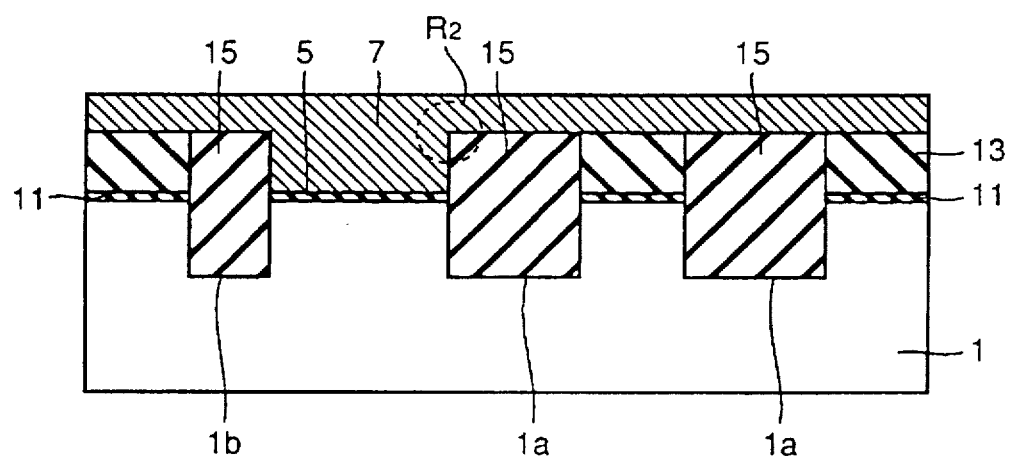

Referring to FIG. 10, a thermal oxidation method or a CVD method is performed to from silicon oxide film 5 of 5 nm in thickness on the main surface of semiconductor substrate 1 at the transistor formation region. Thereafter, a CVD method is performed to form conductive layer 7 of 700 nm in thickness made of, e.g., a polycrystalline silicon film doped with impurity.

Thereafter, conductive layer 7 is patterned by a photolithography and an etching technique so that gate electrode layer 7 shown in FIGS. 1 and 2 is formed. Using gate electrode layer 7 as a mask, processing such as ion implantation of impurity is effected on the main surface of semiconductor substrate 1 at the transistor formation region to form paired source/drain regions 3. In this manner, MOS transistor 10 is completed.

Figure 50:
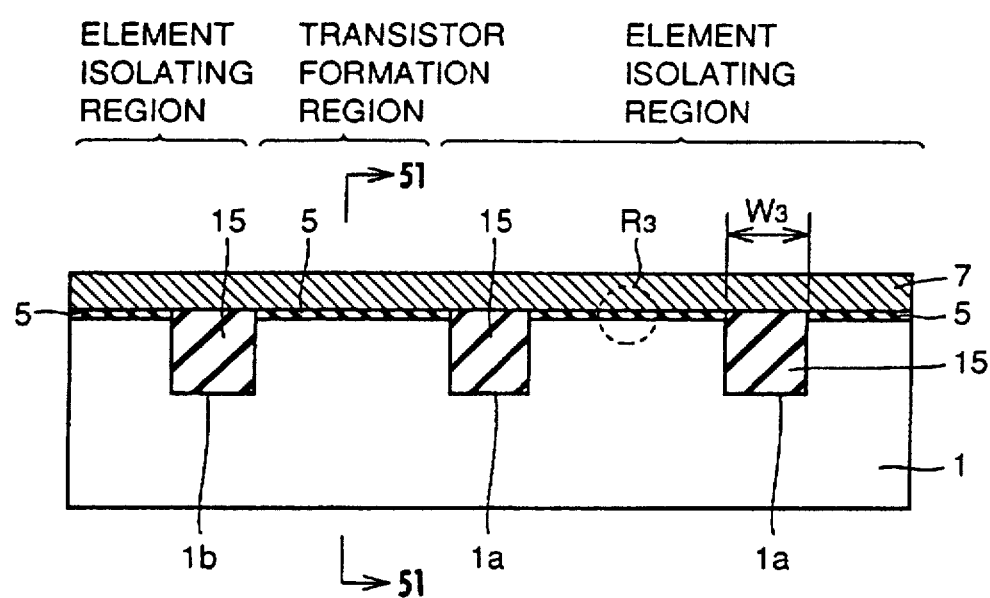
FIG. 50 is a schematic cross section showing a structure provided at an element isolating region with two or more trenches spaced from each other.
Figure 51:
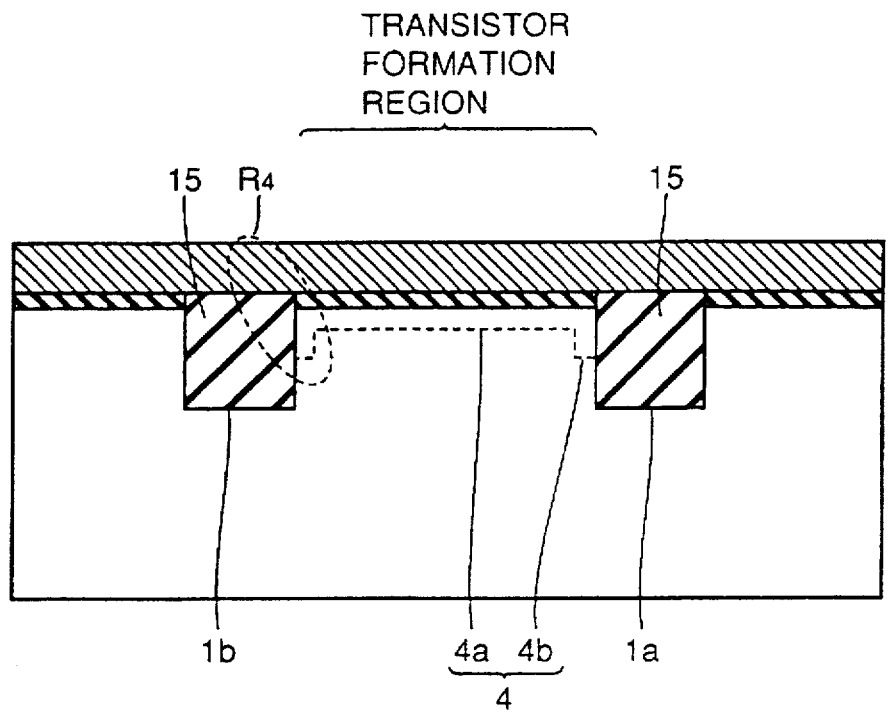
FIG. 51 is a schematic cross section showing generation of a channel in the structure in FIG. 50.
Figure 52:
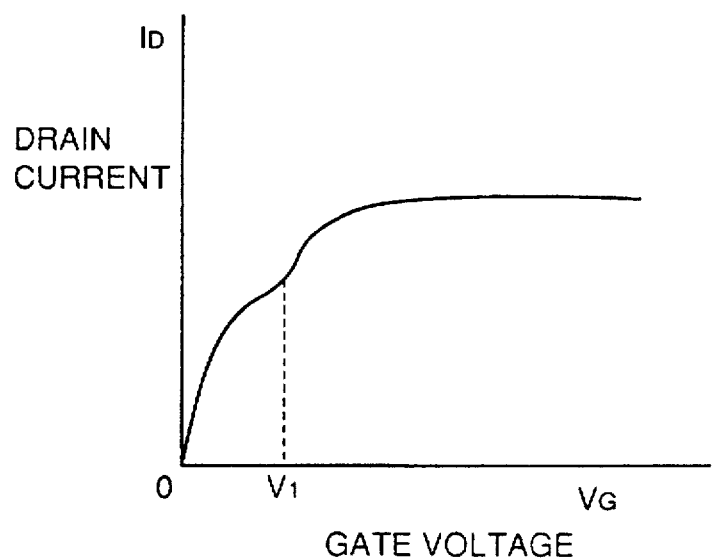
FIG. 52 is a graph showing a relationship between a gate voltage and a drain current in the structure shown in FIG. 50.

In the prior art shown in FIG. 50 already described, the thickness of insulating layer 5 located between gate electrode layer 7 and semiconductor substrate 1 at the transistor formation region is equal to that at the element isolating region.

In contrast to this, the semiconductor device of this embodiment has such a structure that the sum $T_1$ of thicknesses of insulating layers 11 and 13 at the element isolating region is larger than thickness $T_2$ of the gate insulating layer at the transistor formation region. Therefore, even if gate electrode layer 7 has an extended portion located above insulating layer 13 and isolating and insulating layer 15 at the element isolating region, the thickness of the insulating layer located between gate electrode layer 7 and semiconductor substrate 1 at the element isolating region is larger than that at the transistor formation region. Therefore, a parasitic capacitance between gate electrode layer 7 and semiconductor substrate 1 can be smaller than that in the prior art.

Isolating and insulating layers 15 do not merely fill trenches 1a and 1b, but are protruded above the main surface of semiconductor substrate 1. Therefore, a larger space can be ensured between gate electrode layer 7 and semiconductor substrate 1 at region $R_1$ shown in FIG. 2 compared with the structure where isolating and insulating layers 15 merely fill trenches 1a and 1b as shown in the prior art in FIG. 50. Therefore, the channel region can be formed only at the surface region of the transistor formation region. Accordingly, the drain current does not increase rapidly, and propagation of the pulse is not disturbed at the rising, so that a rapid operation is allowed.

Since divided trenches 1a are formed at the element isolating region, each trench 1a can have width $W_1$ of an appropriate value (10 μm or less). Therefore, even if a polishing pad is curved or bent during polishing shown in FIGS. 5 and 6, dishing of the upper surface of the isolating and insulating layer 15 can be prevented. Accordingly, no level difference occurs due to dishing, so that gate electrode layer 7 can be patterned easily and accurately on trenches 1a.

The upper surfaces of insulating layer 13 and isolating and insulating layer 15 form the substantially same plane. Therefore, gate electrode layer 7 or the like on insulating layer 13 and isolating and insulating layer 15 can be patterned accurately.

In the method of manufacturing the semiconductor device of this embodiment, isolating and insulating layer 15 and insulating layer 13 in FIG. 8 are made of materials of different etching rates. In the steps shown in FIGS. 8 and 9, processing of removing insulating layer 13 at the transistor formation region can be performed in such a manner that the isolating and insulating layer 15 is scarcely removed, and only insulating layer 13 can be selectively removed, although the surface of isolating and insulating layer 15 is partially exposed through resist pattern 33b.

The steps for polishing shown in FIGS. 5 and 6 can be performed without damaging the main surface of semiconductor substrate 1, because the main surface of semiconductor substrate 1 is not exposed. Therefore, the MOS transistor can be formed on semiconductor substrate 1 without impairing the reliability.

In this embodiment, patterning must be effected on gate electrode layer 7 on isolating and insulating layer 15 at region $R_2$ having a level difference. In view of this, description will now be given on an embodiment 2 relating to a structure of a semiconductor device, which can avoid etching on a portion having a level difference, as well as a method of manufacturing the same.

EMBODIMENT 2

Figure 11:
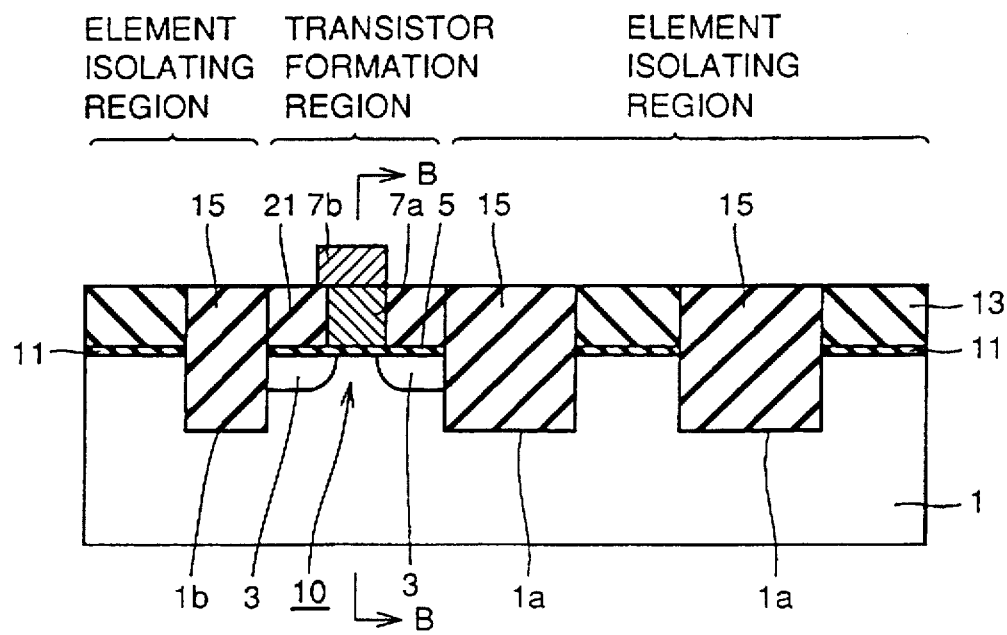
FIG. 11 schematically shows a structure of a semiconductor device of an embodiment 2 of the invention.
Figure 12:
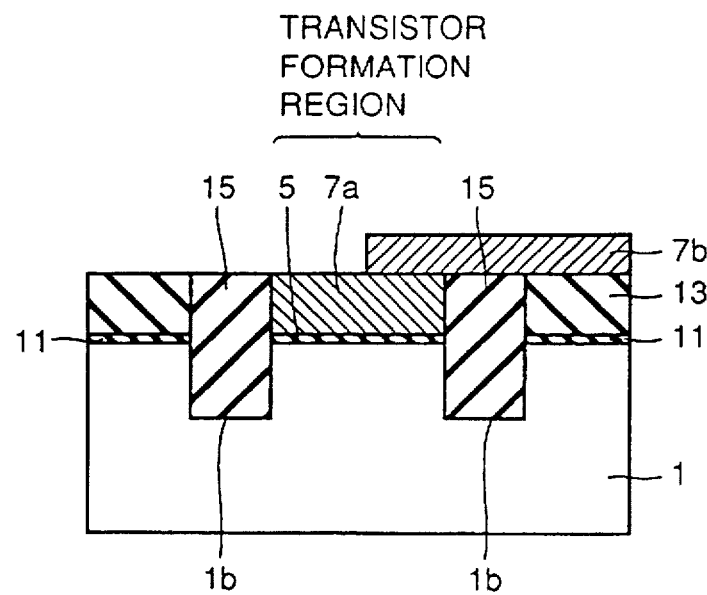
FIG. 12 is a schematic cross section taken along line B—B in FIG. 11.

Referring to FIGS. 11 and 12, a structure of this embodiment differs from the structure of the embodiment 1 particularly in the structure of the gate electrode layer.

The gate electrode layer in this embodiment has a two-layer structure formed of first and second conductive layers 7a and 7b. First conductive layer 7a has an upper surface located at the substantially same level as the upper surfaces of isolating and insulating layer 15 and insulating layer 13. Second conductive layer 7b is in contact with the upper surface of first conductive layer 7a, and has a portion extending over the trench isolation structure.

A region between first conductive layer 7a and isolating and insulating layer 15 is filled with insulating layer 21 made of, e.g., a silicon oxide film. This insulating layer 21 has an upper surface at the same level as the upper surfaces of isolating and insulating layer 15 and insulating layer 13.

Structures other than the above are similar to those of the embodiment 1. The same or similar parts and portions bear the same reference numbers, and will not be described below.

A manufacturing method of this embodiment will be described below.

According to the manufacturing method of this embodiment, steps similar to those of the embodiment 1 shown in FIGS. 3 to 10 are performed. Thereafter, conductive layer 7 shown in FIG. 10 is polished and removed, e.g., by a polishing method to expose the upper surfaces of isolating and insulating layer 15 and insulating layer 13.

Figure 13:
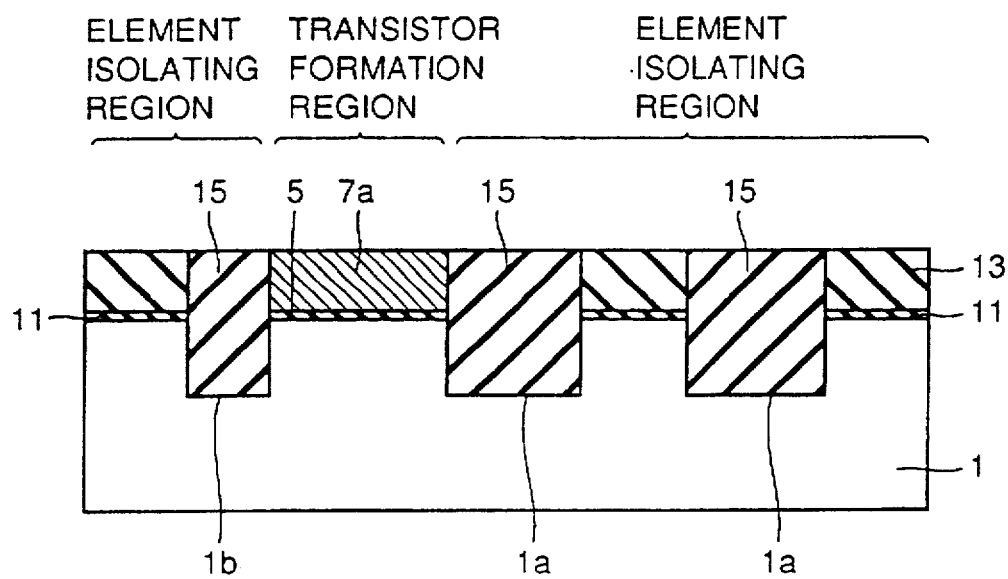
FIGS. 13 to 15 are schematic cross sections showing 1st to 3rd steps in a method of manufacturing the semiconductor device of the embodiment 2 of the invention, respectively.

Referring to FIG. 13, conductive layer 7a thus polished has the upper surface which forms together with the upper surfaces of isolating and insulating layer 15 and insulating layer 13 the substantially same plane. Thereafter, conductive layer 7a is patterned by a photolithography and an etching method.

Figure 14:
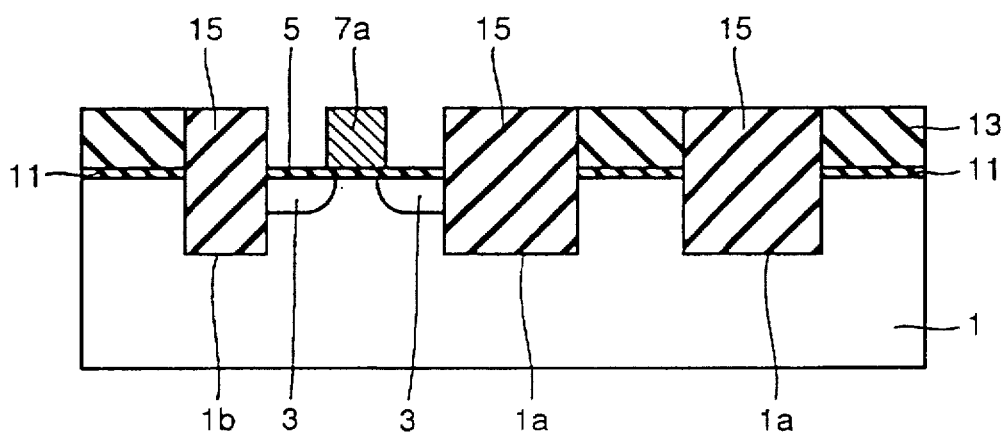

Referring to FIG. 14, this patterning forms first conductive layer 7a forming the gate electrode layer. Thereafter, impurity is introduced, e.g., by ion implantation into the main surface of semiconductor substrate 1 masked with first conductive layer 7a, so that paired source/drain regions 3 are formed.

Figure 15:
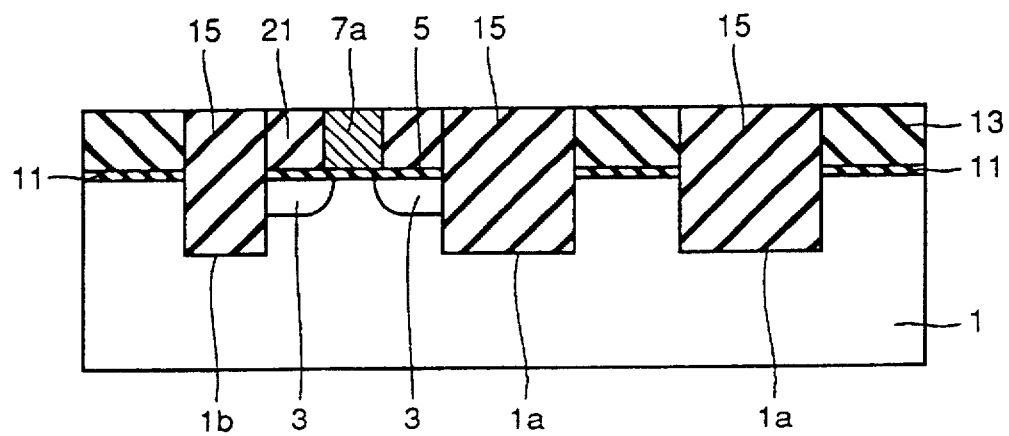

Referring to FIG. 15, insulating layer 21 of 500 nm in thickness made of a silicon oxide film is formed over the entire surface, e.g., by a CVD method. Insulating layer 21 is polished and removed by an etchback or polishing method to expose the upper surfaces of first conductive layer 7a, isolating and insulating layer 15 and insulating layer 13. Thereby, insulating layer 21 is left only at the position filling the space between first conductive layer 7a and isolating and insulating layer 15, and has the upper surface at the substantially same level as the upper surfaces of these layers. Thereafter, a metal silicide layer 7b is formed, e.g., by a CVD method, and then is patterned by photolithography or etching. This completes second conductive layer 7b shown in FIGS. 11 and 12 which is electrically connected to first conductive layer 7a and extends above the trench isolation structure.

The manufacturing method described above does not require patterning of the gate electrode layer on the portion having a level difference caused by isolating and insulating layer 15. This allows precise patterning of gate electrode layers 7a and 7b.

EMBODIMENT 3

Figure 16:
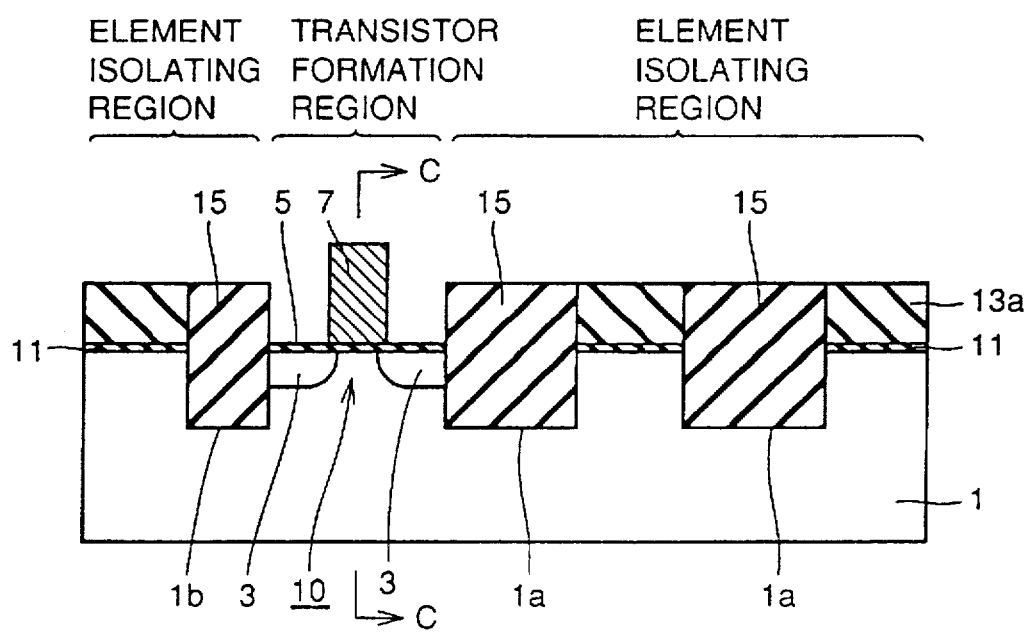
FIG. 16 schematically shows a structure of a semiconductor device of an embodiment 3 of the invention.
Figure 17:
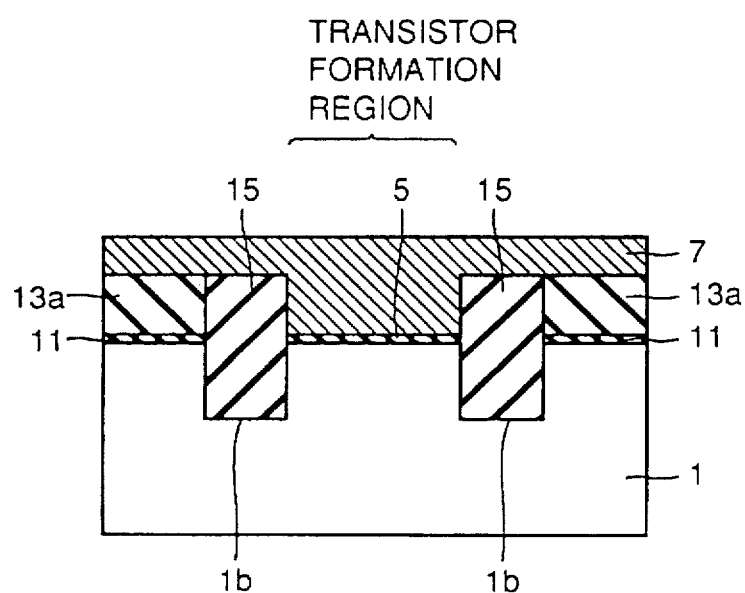
FIG. 17 is a schematic cross section taken along line C—C in FIG. 16.

Referring to FIGS. 16 and 17, a structure of a semiconductor device of this embodiment differs from that of the embodiment 1 shown in FIGS. 1 and 2 in a material of an insulating layer 13a. More specifically, insulating layer 13a in this embodiment is made of, e.g., a silicon nitride film.

Structures other than the above are similar to those of the embodiment 1. The same or similar parts and portions bear the same reference numbers, and will not be described below.

A method of manufacturing the semiconductor device of this embodiment will be described below.

Figure 18:
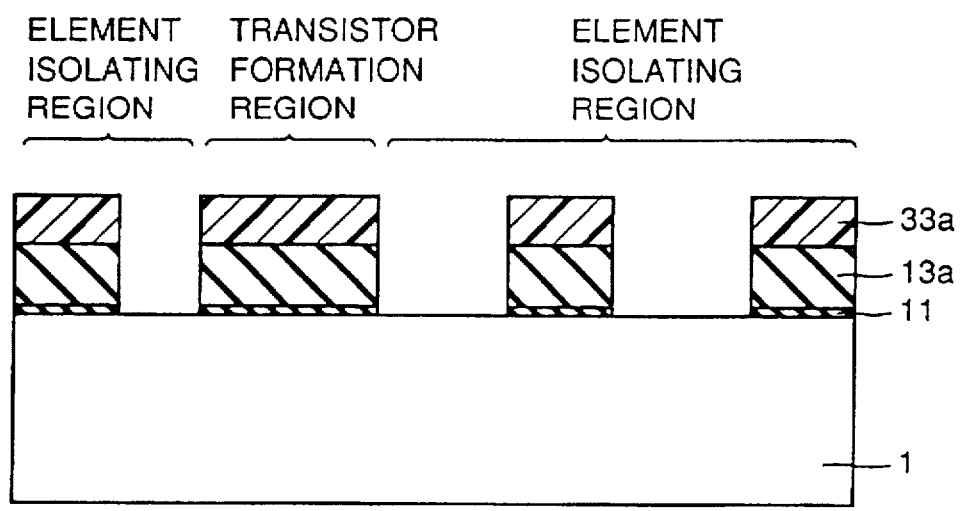
FIGS. 18 to 23 are schematic cross sections showing 1st to 6th steps in a method of manufacturing the semiconductor device of the embodiment 3 of the invention, respectively.

FIGS. 18 to 23 are schematic cross sections showing, in the order of steps, the method of manufacturing the semiconductor device of the embodiment 3 of the invention. Referring first to FIG. 18, a thermal oxidation method or a CVD method is performed to form insulating layer 11 of 20 nm in thickness made of a silicon oxide film on the main surface of semiconductor substrate 1. On insulating layer 11, insulating layer 13a made of a silicon nitride film and having a thickness of 500 nm is formed, e.g., by a CVD method. Resist pattern 33a having a predetermined configuration is formed on insulating layer 13a by photolithography. Thereafter, a dry etching method is performed to etch successively insulating layers 13a and 11 masked with resist pattern 33a. Thereby, the main surface of semiconductor substrate 1 is partially exposed.

Then, etching is effected on the exposed main surface of semiconductor substrate 1 which is still masked with resist pattern 33a. Thereafter, resist pattern 33a is removed, e.g., by ashing.

Figure 19:
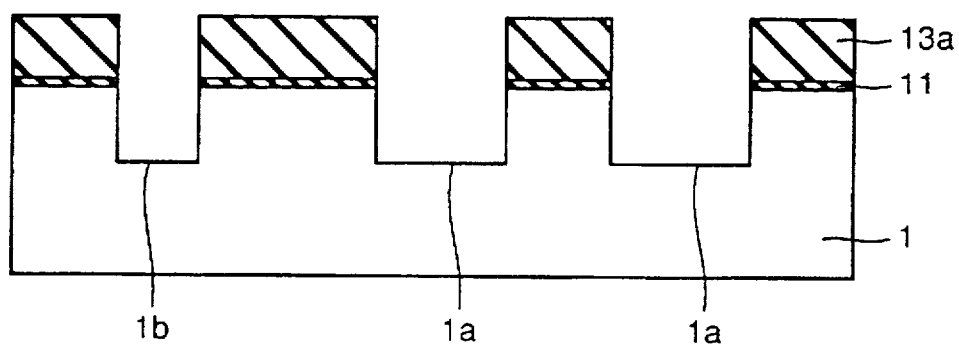

Referring to FIG. 19, the above etching forms trenches 1a and 1b from 200 to 400 nm in depth at the main surface of semiconductor substrate 1.

Figure 20:
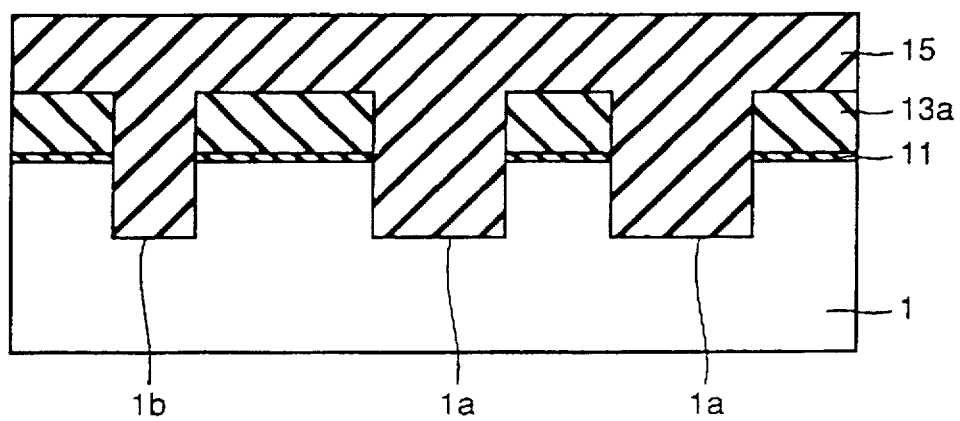

Referring to FIG. 20, a CVD method or the like is performed to form isolating and insulating layer 15, which is made of a silicon oxide film, fills trenches 1a and 1b and covers insulating layer 13a. The thickness of isolating and insulating layer 15 is larger than a sum of thicknesses of insulating layers 11 and 13a and trench 1a.

By a polishing or etchback method, isolating and insulating layer 15 is polished or etched to expose at least the upper surface of insulating layer 13a.

Figure 21:
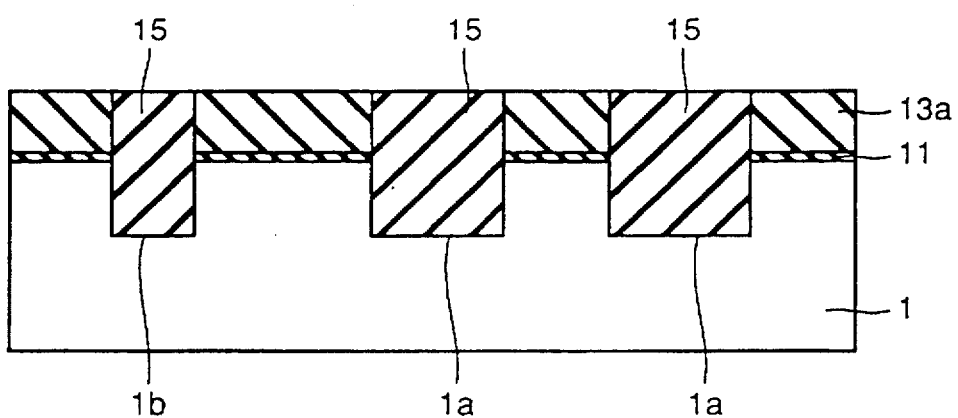

Referring to FIG. 21, this etching or polishing form the isolating and insulating layers 15, which fill trenches 1a and 1b, respectively, and have the upper surfaces at the same level as the upper surface of insulating layer 13a.

During this polishing or etchback, insulating layer 13a serves as a stopper.

Figure 22:
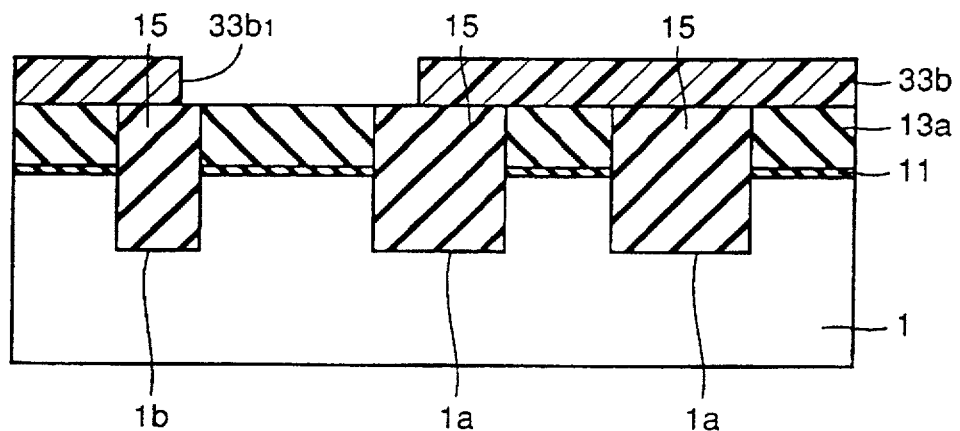

Referring to FIG. 22, a step is performed to form photolithographically resist pattern 33b having hole pattern $33b_1$, which exposes at least the upper surface of insulating layer 13a at the transistor formation region. Hole pattern $33b_1$ has the opening size similar to that already described in connection with the embodiment 1.

Using resist pattern 33b as a mask, dry etching is performed to remove selectively insulating layer 13a at the transistor formation region. A gas mixture of $CHF_3$ and $H_2$ is used for this dry etching. By controlling a partial pressure of $H_2$, selectivity ratios of etching of the silicon oxide film and the silicon nitride film are freely set. Further, insulating layer 11 at the transistor formation region is removed by the etching. Thereafter, resist pattern 33b is removed, e.g., by ashing.

Figure 23:
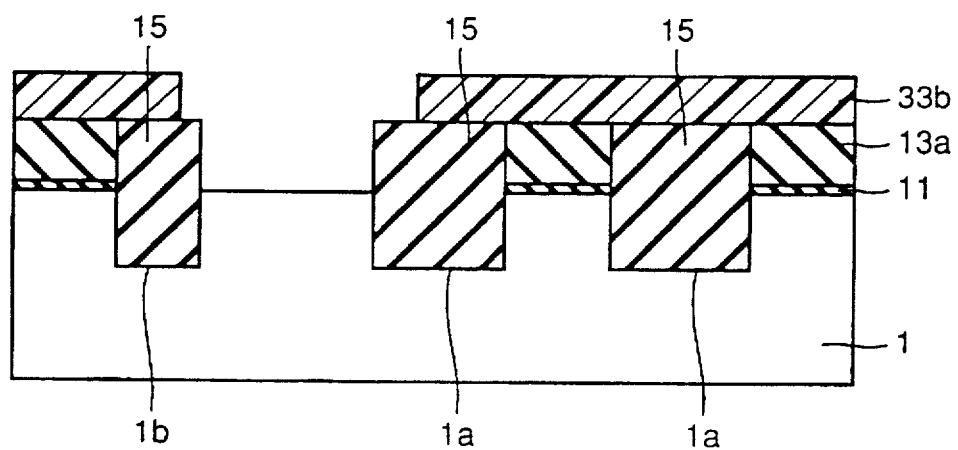

Referring to FIG. 23, the etching effected on insulating layer 11 exposes the main surface of semiconductor substrate 1 at the transistor formation region. Thereafter, a steps similar to that in the embodiment 1 shown in FIG. 10 is performed, so that the semiconductor device shown in FIGS. 16 and 17 is completed.

The manufacturing method of the embodiment has been described in connection with the structure shown in FIGS. 16 and 17, in which isolating and insulating layer 15 is made of a silicon oxide film and insulating layer 13a is made of a silicon nitride film. However, isolating and insulating layer 15 may be made of a silicon nitride film, and insulating layer 13a may be made of a silicon oxide film. In this case, the partial pressure of $H_2$ in the gas mixture of $CHF_3$ and $H_2$ is controlled for the etching of insulating layer 13a shown in FIGS. 22 and 23, so that the etching rate of the silicon oxide film can be larger than that of the silicon nitride film in contrast to the above case. Even in the case where etching is performed with HF aqueous solution instead of the gas mixture, the etching rate of silicon oxide film exceeds the etching rate of the silicon nitride film.

In the case of dry etching, the selectivity ratio of etching which is effected on the silicon oxide film masked with the silicon nitride film can be larger than that of etching effected on the silicon nitride film masked with the silicon oxide film. Therefore, it is desirable that the isolating and insulating film 15 is made of a silicon nitride film and insulating layer 13a is made of a silicon oxide film, if dry etching is employed.

In the polishing process shown in FIGS. 20 and 21, a polishing rate of a silicon nitride film is smaller than that of a silicon oxide film. Therefore, from the viewpoint of polishing, it is desirable that isolating and insulating layer 15 is made of a silicon nitride film and insulating layer 13a is made of a silicon oxide film.

EMBODIMENT 4

In the above embodiment 3, insulating layer 13a is made of the silicon nitride film, which has a relative dielectric constant larger than that of the silicon oxide film. In the embodiment 3, therefore, the parasitic capacitance of gate electrode layer 7 may be larger than that in the embodiment 1. This disadvantage can be effectively overcome by this embodiment, in which the silicon nitride film is replaced with a silicon oxide film doped with at least either of phosphorus or boron. A method of manufacturing the semiconductor device of this embodiment will be described below.

A manufacturing method of this embodiment is performed through steps similar to those in the embodiment 3 shown in FIGS. 18 to 21. Thereafter, insulating layer 13a made of a silicon nitride film shown in FIG. 21 is selectively removed by thermal phosphoric acid.

Figure 24:
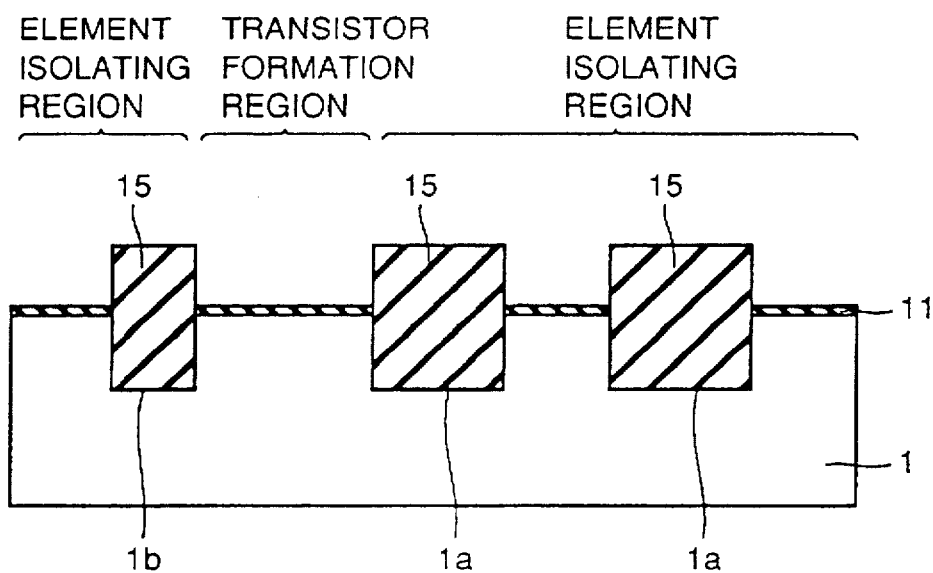
FIGS. 24 to 28 are schematic cross sections showing 1st to 5th steps in a method of manufacturing a semiconductor device of an embodiment 4 of the invention, respectively.

Thereby, the surface of insulating layer 11 made of the silicon oxide film is exposed as shown in FIG. 24.

Figure 25:
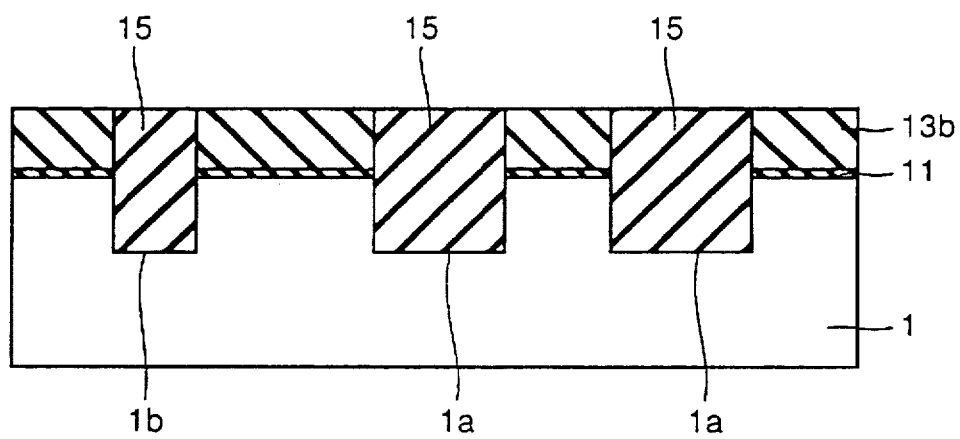

Referring to FIG. 25, a silicon oxide film having a thickness of 700 nm and doped with at least either of phosphorus or boron is formed on the entire surface, e.g., by a CVD method. This silicon oxide film is polished or etched, e.g., by a polishing method or a etchback method to expose at least the upper surface of isolating and insulating layer 15. Thereby, insulating layer 13b, which is made of a silicon oxide film doped with at least phosphorus or boron, has the upper surface at the substantially same level as the upper surface of isolating and insulating layer 15.

Figure 26:
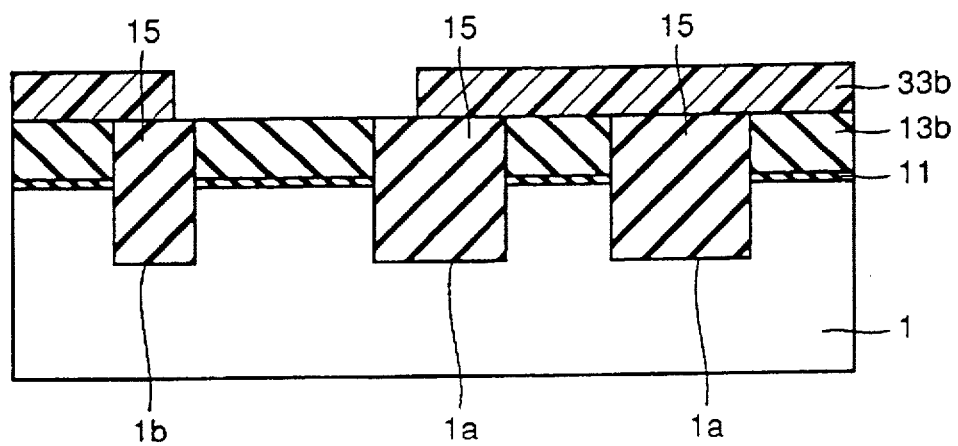

Referring to FIG. 26, a step similar to that shown in FIG. 8 is performed to form resist pattern 33b by photolithography. Using this resist pattern 33b as a mask, etching is effected on insulating layer 13b at the transistor formation region with HF vapor.

Figure 27:
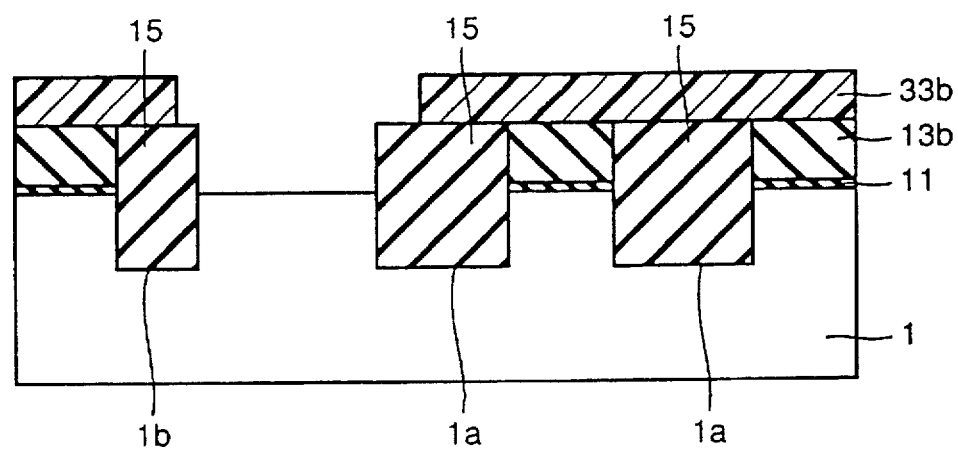

Referring to FIG. 27, this etching selectively removes only insulating layer 13b at the transistor formation region, so that the surface of insulating layer 11 is exposed. Thereafter, insulating layer 11 is removed by etching.

In this manner, the main surface of semiconductor substrate 1 at the transistor formation region is exposed.

Figure 28:
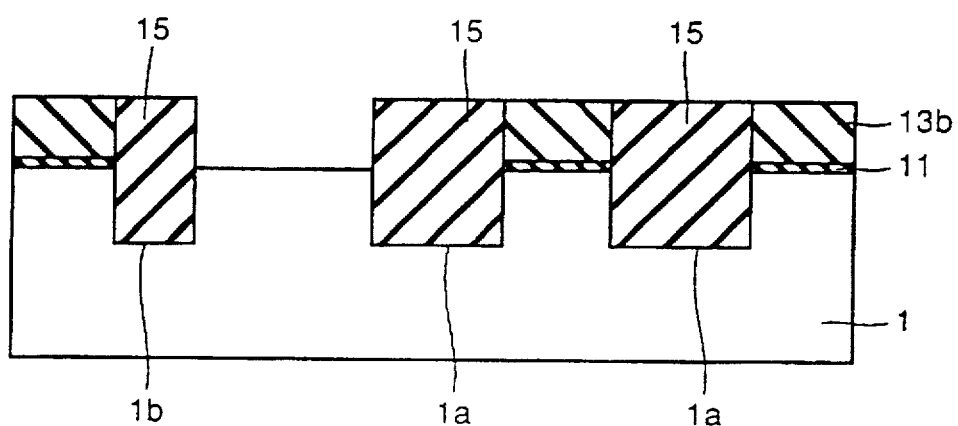

Resist pattern 33b is removed, e.g., by an ashing method to attain a state shown in FIG. 28. The structure in this state is processed similarly to the embodiment 1 to form the gate insulating layer and gate electrode layer.

In this embodiment, insulating layer 13b is made of a silicon oxide film doped with at least either phosphorus or boron. Therefore, the parasitic capacitance of gate electrode layer 7 can be reduced as compared with the structure provided with insulating layer 13b made of the silicon nitride film.

EMBODIMENT 5

In the embodiment 3, insulating layer 13a shown in FIG. 18 is made of the silicon nitride film. However, a polycrystalline silicon layer formed by a CVD method or an amorphous silicon layer may be used instead of the silicon nitride film. An embodiment including insulating layer 13a made of polycrystalline silicon or amorphous silicon will be described below.

Figure 29:
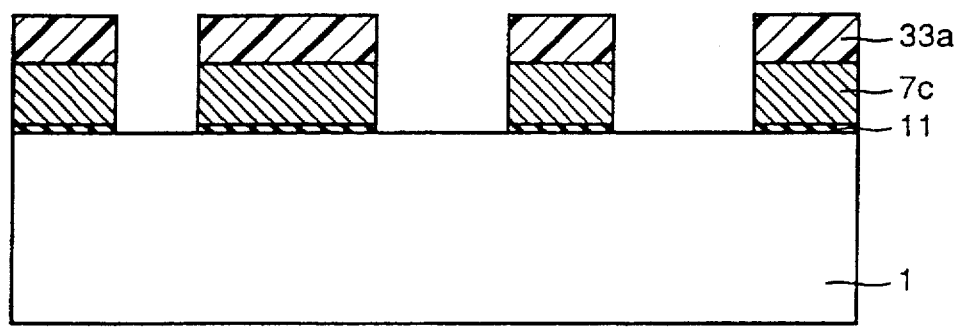
FIGS. 29 to 34 are schematic cross sections showing 1st to 6th steps in a method of manufacturing a semiconductor device of an embodiment 5 of the invention, respectively.

Referring to FIG. 29, insulating layer 11 made of a silicon oxide film and having a thickness of 10 nm is formed on the main surface of semiconductor substrate 1, e.g., by a thermal oxidation method or a CVD method. A conductive layer 7c of 400 nm in thickness made of a polycrystalline silicon film is formed on insulating layer 11, e.g., by a CVD method. Conductive layer 7c may be made of amorphous silicon instead of polycrystalline silicon.

Resist pattern 33a having a predetermined configuration is formed on conductive layer 7c by photolithography. Using resist pattern 33a as a mask, conductive layer 7c and insulating layer 11 are successively etched to expose a portion of the main surface of semiconductor substrate 1. Etching is effected on the main surface of semiconductor substrate 1 which is still masked with resist pattern 33a. Thereafter, resist pattern 33a is removed, e.g., by an ashing method.

Figure 30:
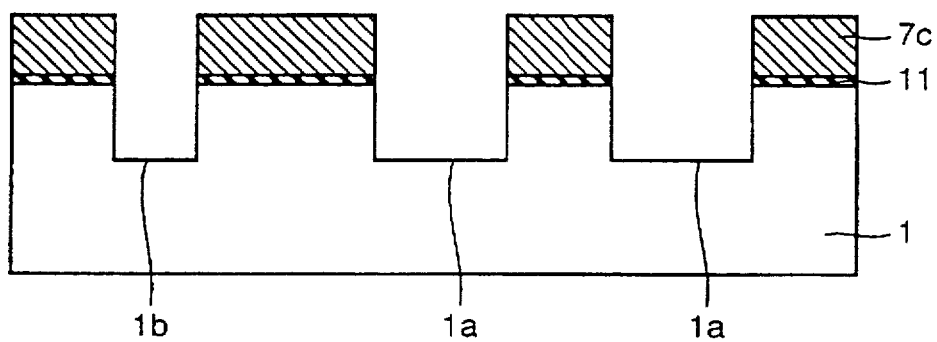

Referring to FIG. 30, this etching forms trenches 1a and 1b having a depth from 200 to 400 nm at the main surface of semiconductor substrate 1.

Figure 31:
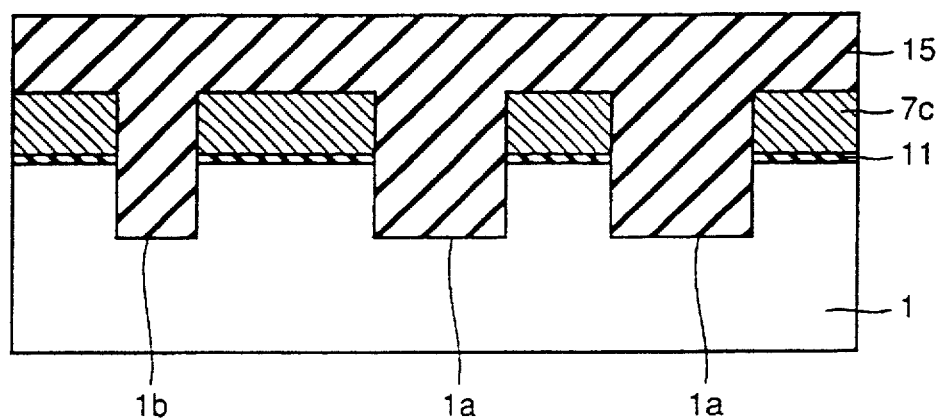

Referring to FIG. 31, a step is performed to form insulating layer 15, e.g., of 800 nm in thickness, which fills trenches 1a and 1b, covers conductive layer 7c and is made of a silicon oxide film. Thereafter, insulating layer 15 is polished or etched by a polishing or etchback method to expose the upper surface of conductive layer 7c.

Figure 32:
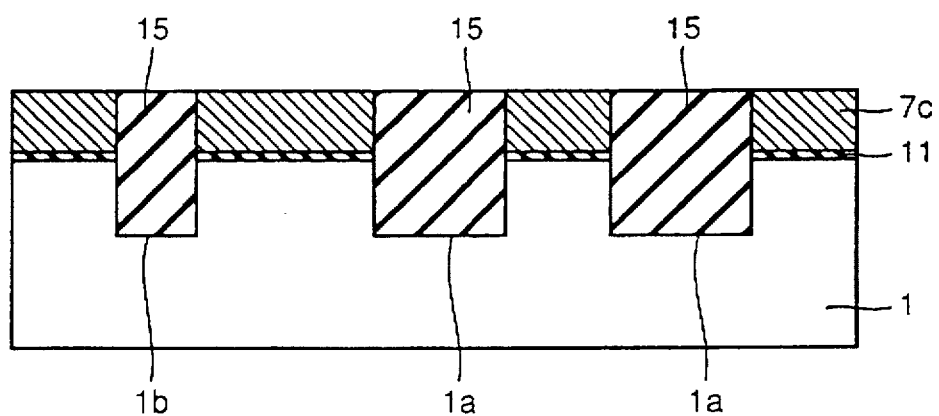

Referring to FIG. 32, the above step forms isolating and insulating layers 15, which fill trenches 1a and 1b, and have upper surfaces at the substantially same level as the upper surface of conductive layer 7c. Thereafter, conductive layer 7c is removed by a dry etching method.

Figure 33:
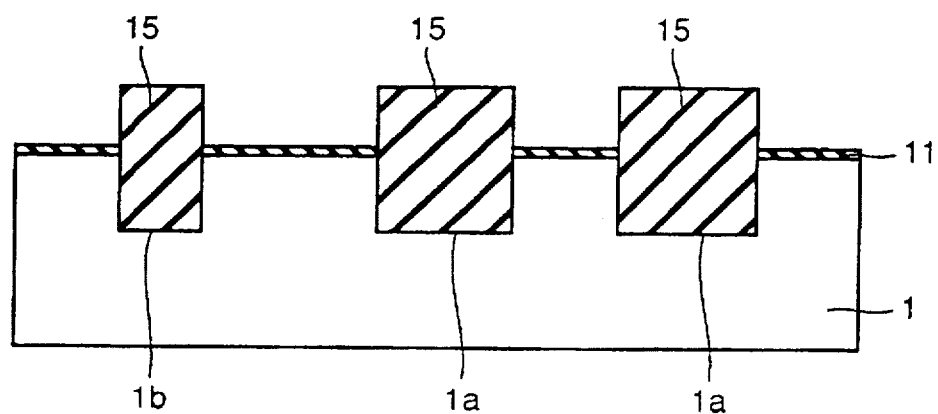

Referring to FIG. 33, the surface of insulating layer 11 is thereby exposed.

Figure 34:
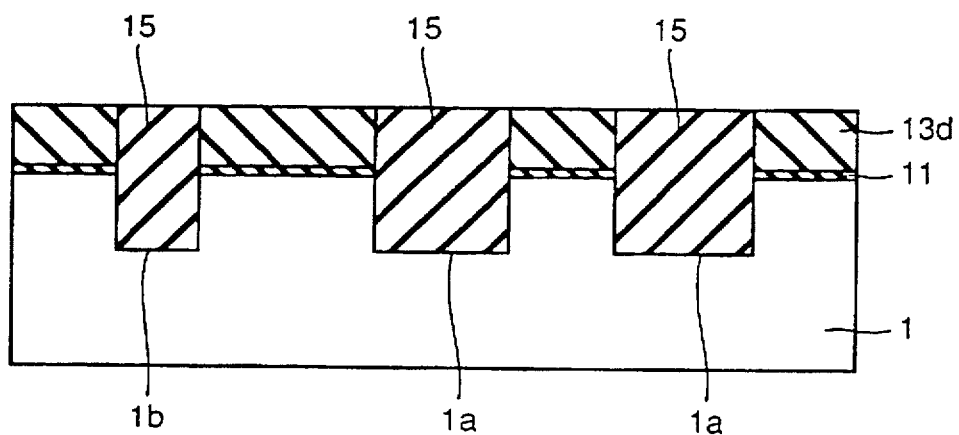

Referring to FIG. 34, a step is performed to form an insulating layer 13d of 600 nm in thickness, which covers insulating layer 11 and isolating and insulating layers 15, and is made of a silicon oxide film (e.g., PSG film or BPSG film) containing at least boron or phosphorus. Thereafter, insulating layer 13d is polished by a polishing method to expose the upper surfaces of isolating and insulating layers 15. Thereby, insulating layer 13d is left such that the upper surface thereof is substantially at the same level as the upper surface of isolating and insulating layer 15.

Through steps similar to those of the embodiment 4 shown in FIGS. 25 to 28, the MOS transistor is formed, and the semiconductor device is completed.

This embodiment can achieve an effect similar to that of the embodiment 4.

EMBODIMENT 6

In this embodiment 5, conductive layer 7c made of polycrystalline silicon is entirely removed as shown in FIGS. 32 and 33. However, conductive layer 7c may be partially left as a gate electrode. A manner of leaving the conductive layer portion as the gate electrode will be described below as the embodiment 6.

Figure 35:
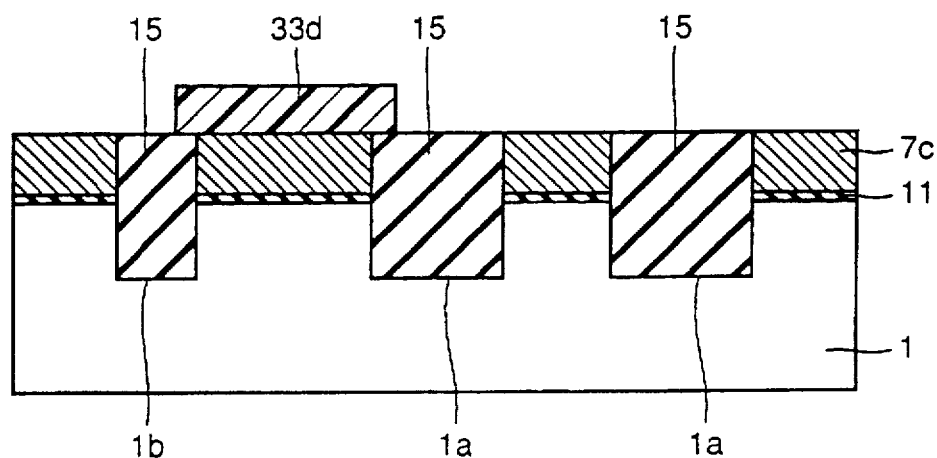
FIGS. 35 to 37 are schematic cross sections showing 1st to 3rd steps in a method of manufacturing a semiconductor device of an embodiment 6 of the invention, respectively.

In a manufacturing method of this embodiment, steps similar to those of the embodiment 5 shown in FIGS. 29 to 32 are performed. Referring to FIG. 35, a resist pattern 33d is then formed by photolithography only on conductive layer 7c at the transistor formation region. Dry etching is effected on conductive layer 7c masked with resist pattern 33d.

Figure 36:
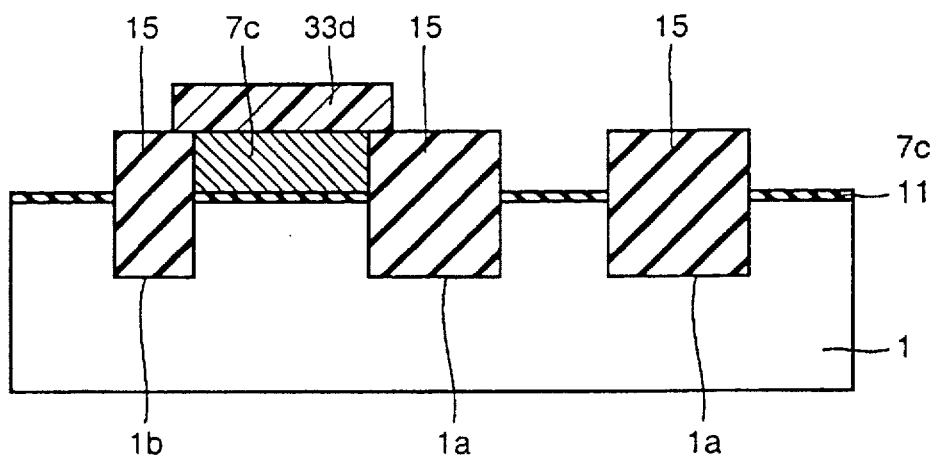

Referring to FIG. 36, this dry etching removes conductive layer 7c at regions other than the transistor formation region, so that the surface of insulating layer 11 is exposed. Thereafter, resist pattern 33d is removed.

Figure 37:
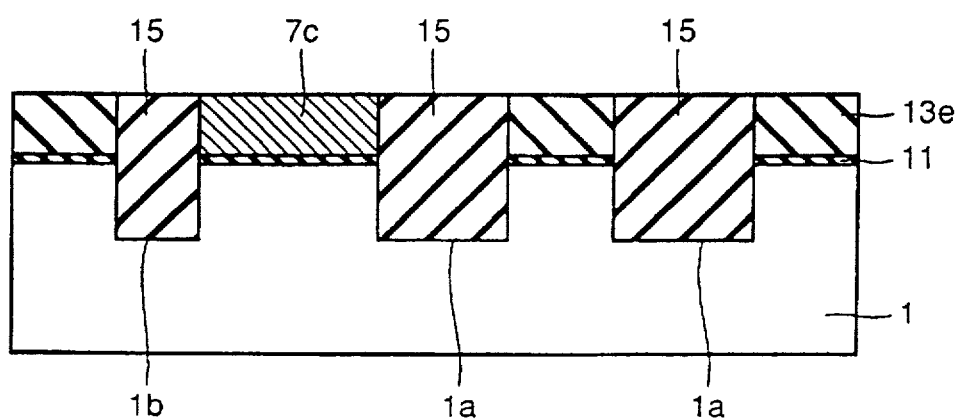

Referring to FIG. 37, a step is performed to form an insulating layer 13e having a thickness of 600 nm and made of a silicon oxide film (PSG film and BPSG film) containing at least boron or phosphorus. Thereafter, insulating layer 13e is polished by a polishing method to expose the upper surface of isolating and insulating layer 15. This leaves, on the insulating layer 11 at the regions other than the transistor formation region, insulating layer 13e having an upper surface at the substantially same level as the upper surfaces of isolating and insulating layer 15 and conductive layer 7c.

Insulating layer 13e may be made of a silicon oxide film not substantially containing impurity. However, if the filling structure is to be formed by the polishing method, it should be noted that the polishing rate of the BPSG film is several to about ten times larger than that of the silicon oxide film not containing impurity. By employing insulating layer 13e made of the BPSG film or the like, therefore, reduction in thickness of isolating and insulating layer 15 can be suppressed, so that the filling structure can be formed more effectively.

Thereafter, steps similar to those of the embodiment 2 shown in FIGS. 14 and 15 are performed, so that the conductive layer 7c can be used as the gate electrode layer.

The manufacturing method of this embodiment does not require a process of once removing conductive layer 7c and then forming a new gate electrode layer. Therefore, the manufacturing steps can be reduced in number compared with the embodiment 5.

In this embodiment, conductive layer 7c may be made of amorphous silicon or metal silicide such as $TiSi_2$, or may be formed of layered films made of them. Conductive layer 7c may be formed of layered films made of metal nitride such as TiN and metal silicide. These films can be dry-etched with chlorine in the step in FIG. 36, similarly to polycrystalline silicon. Therefore, etching can be selectively effected on isolating and insulating layer 15 made of a silicon oxide film.

Figure 38:
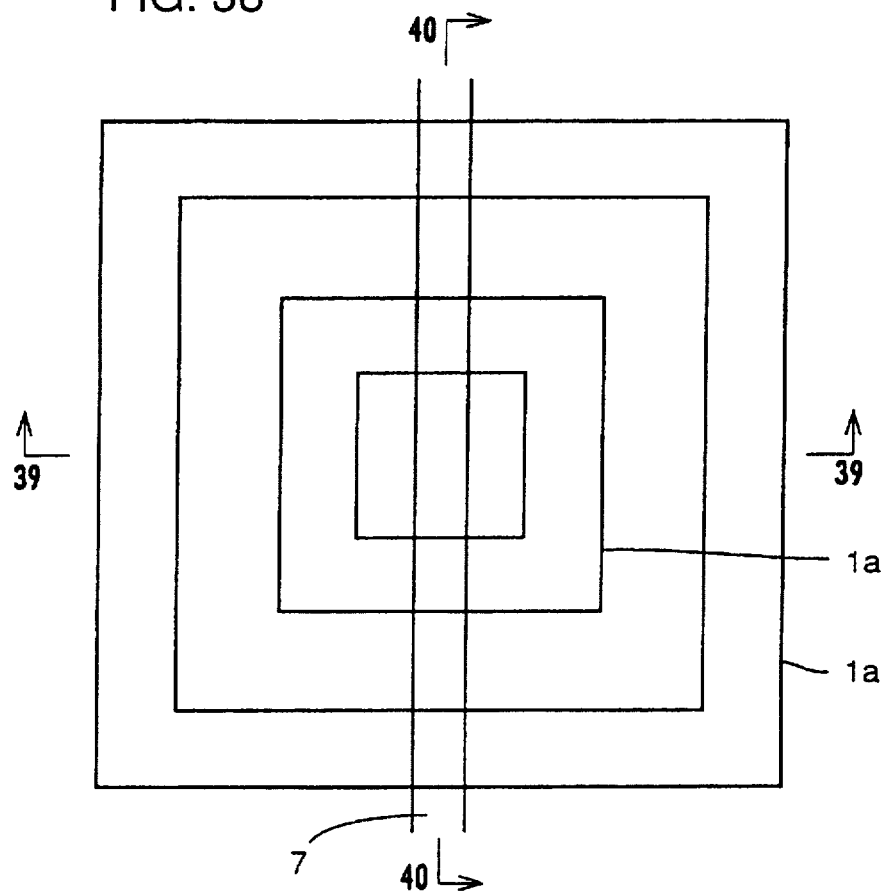
FIG. 38 is a schematic plane showing a transistor formation region surrounded by an element isolating region having two or more trenches.
Figure 39:
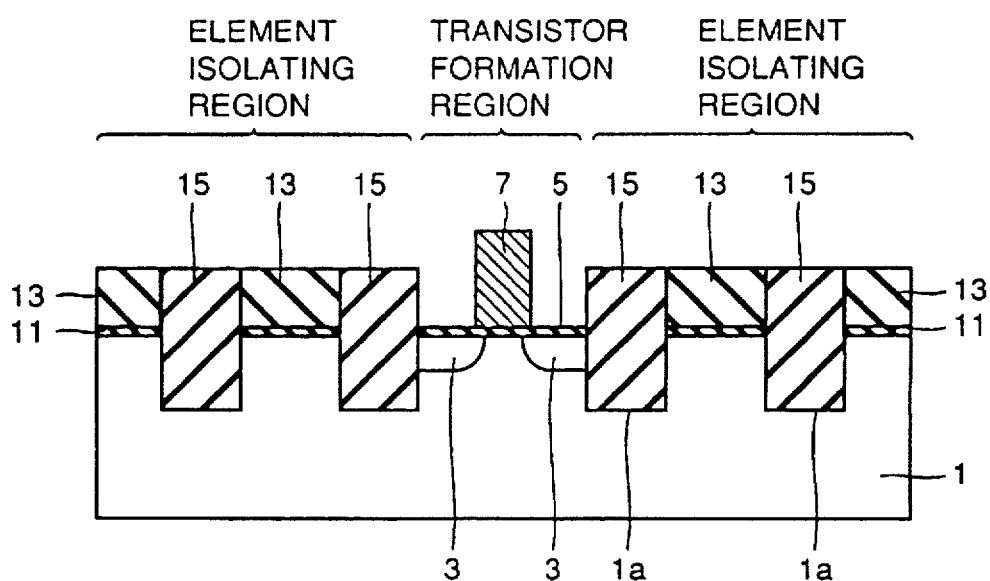
FIG. 39 is a schematic cross section taken along line 39—39 in FIG. 38.
Figure 40:
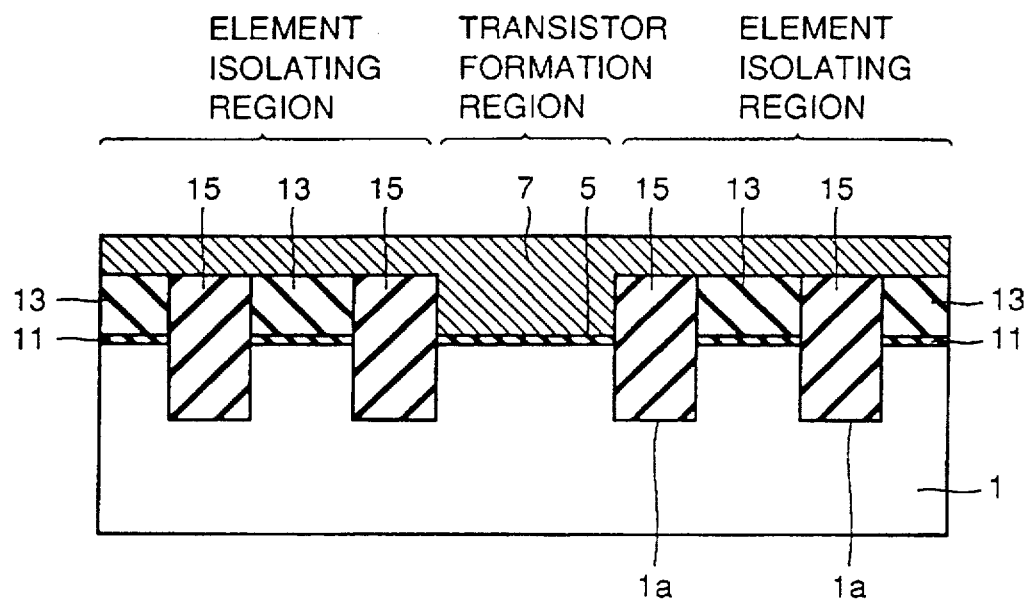
FIG. 40 is a schematic cross section taken along line 40—40 in FIG. 38.
Figure 41:
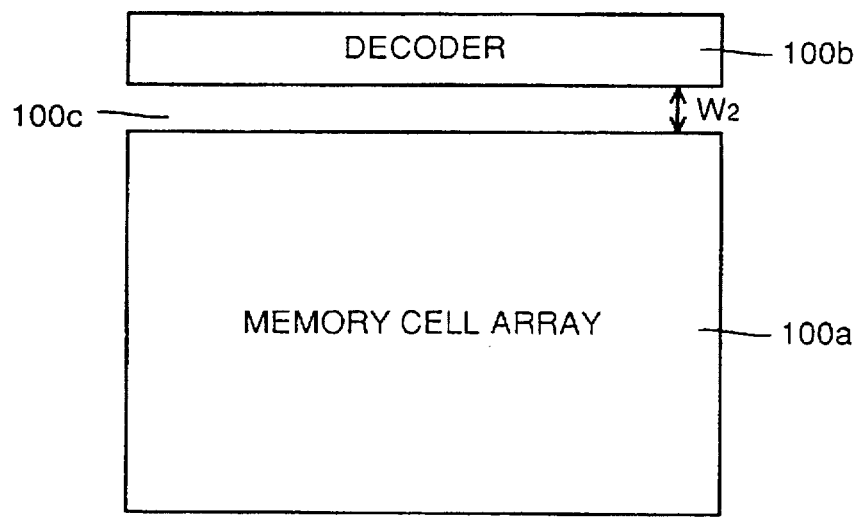
FIG. 41 schematically shows a space on a planar layout of a memory cell array and a peripheral circuit region such as a decoder, e.g., in a DRAM.
Figure 42:
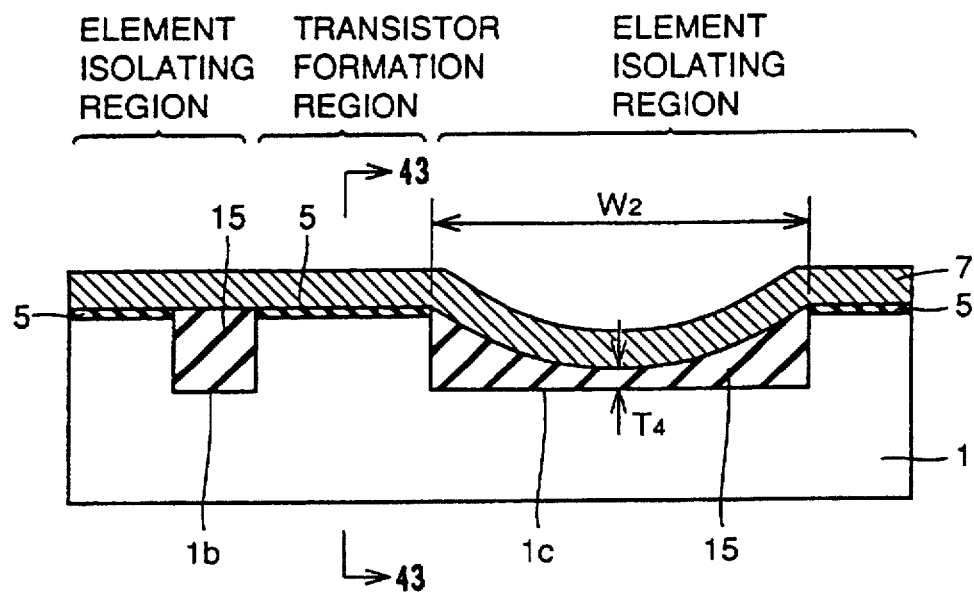
FIG. 42 is a cross section schematically showing a structure of a conventional semiconductor device.
Figure 43:
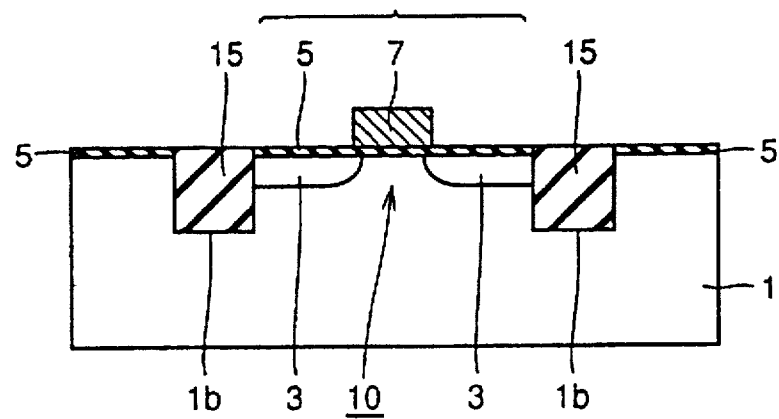
FIG. 43 is a schematic cross section taken along line 43—43 in FIG. 42.
Figure 44:
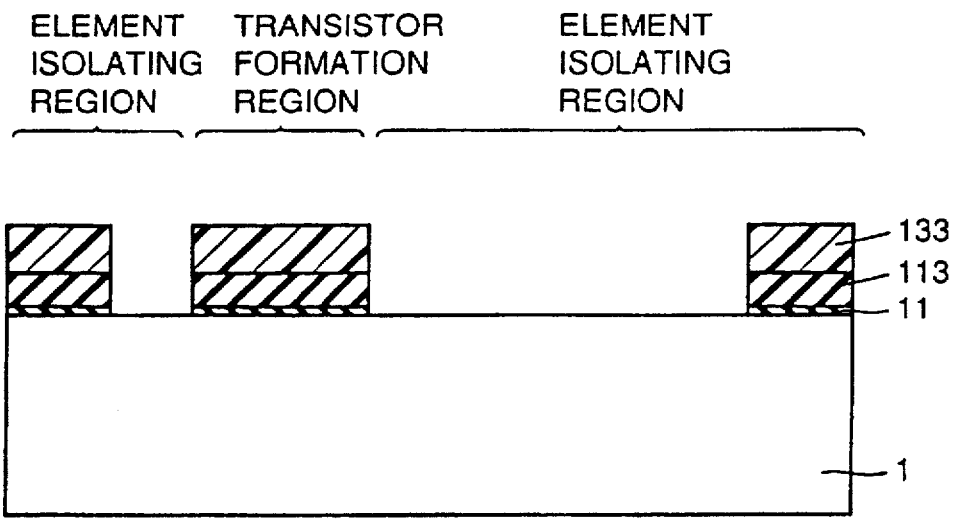
FIGS. 44 to 49 are schematic cross sections showing 1st to 6th steps in a method of manufacturing a semiconductor device in the prior art.
Figure 45:
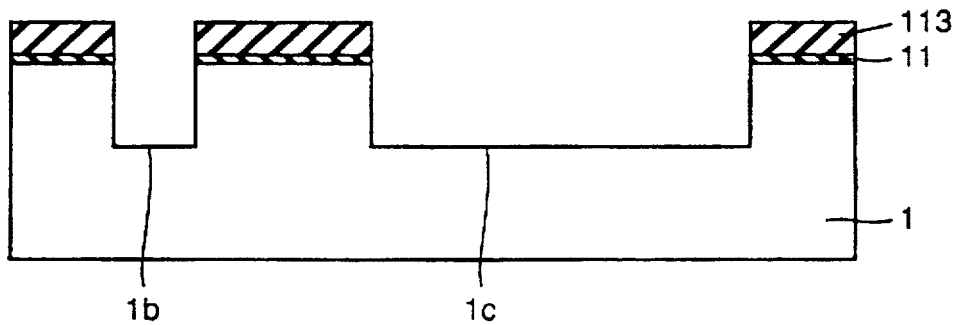
Figure 46:
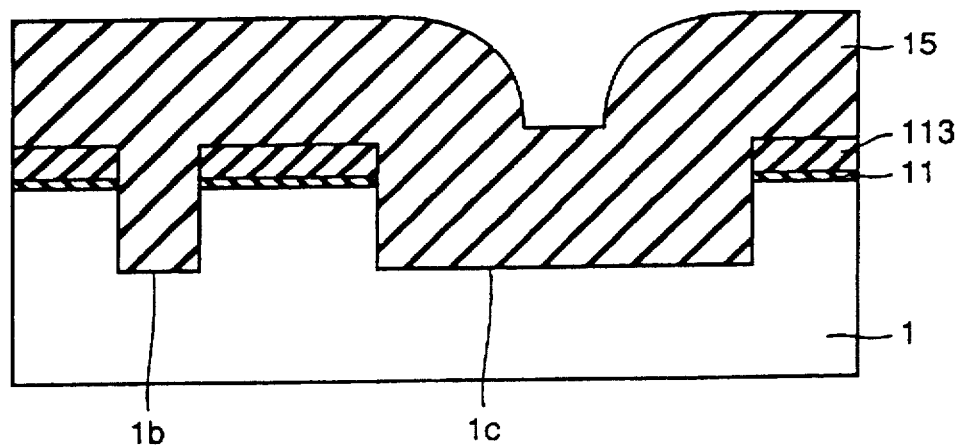
Figure 47:
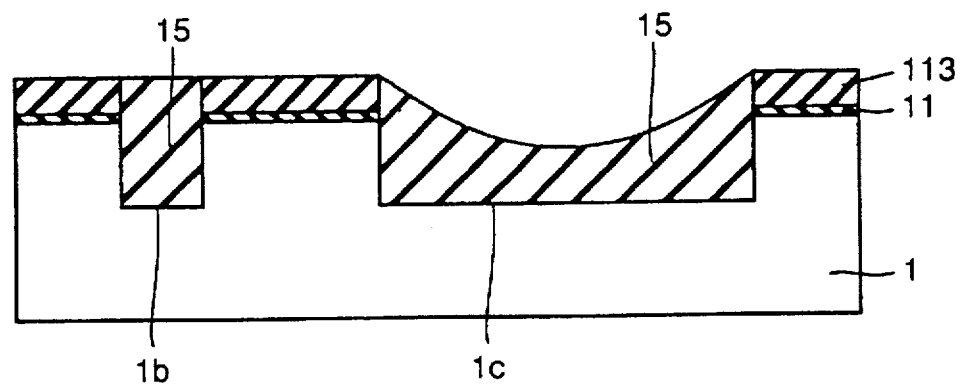
Figure 48:
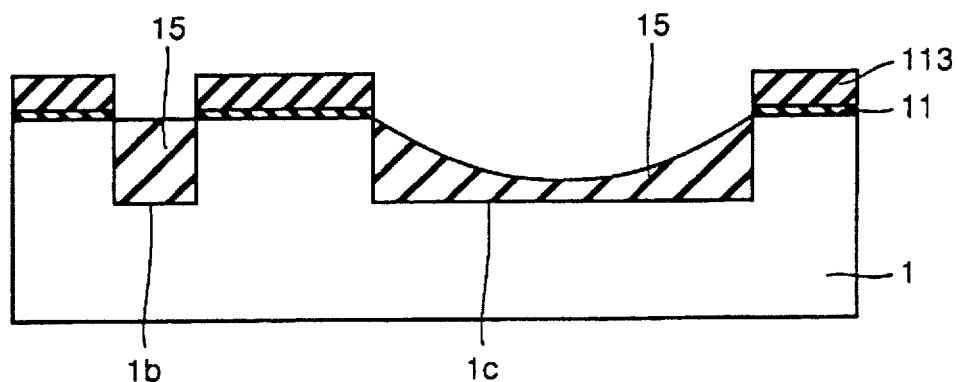
Figure 49:
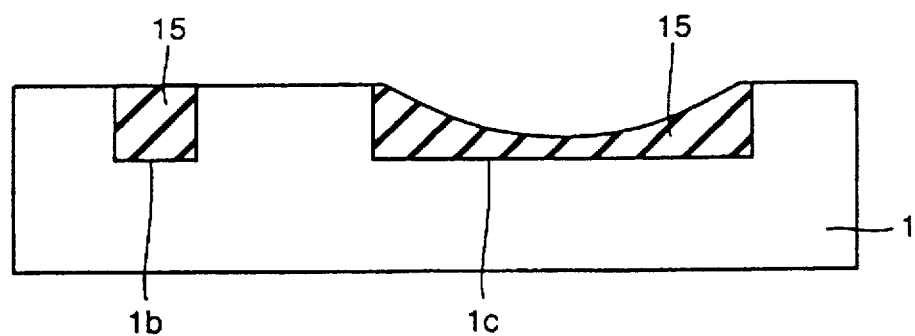

In the embodiments 1–6 described above, the transistor formation region may be surrounded by the element isolating region having two or more trenches as shown in FIGS. 38 to 40.

FIG. 38 is a schematic plan showing the transistor formation region surrounded by the element isolating region having two or more trenches. FIGS. 39 and 40 are schematic cross sections taken along lines 39—39 and 40—40 in FIG. 38, respectively.

According to the semiconductor device of the invention, the second insulating layer at the element isolating region is thicker than the third insulating layer at the element formation region. Therefore, the film thickness of the insulating layer located between the conductive layer and the semiconductor substrate at the element isolating region is larger than that at the element formation region. Accordingly, it is possible to reduce a parasitic capacitance between the conductive layer and the semiconductor substrate at the element isolating region.

The first insulating layer filling the trench at the element isolating region is protruded above the main surface, and the protruded portion has the side surface substantially continuous with the side surface of the trench. Therefore, a large space can be ensured between the semiconductor substrate and the conductive layer located above the first insulating layer, compared with the prior art including an insulating layer merely filling a trench. Therefore, in the structure where the conductive layer forms the gate electrode layer, the channel can be formed only at the surface region of the element formation region. Therefore, the drain current does not increase rapidly, and a waveform of pulse is not disturbed at the rising, so that a fast operation is allowed.

Since the plurality of divided trenches are formed at the element isolating region, each trench can have a width of an appropriate value. Therefore, it is possible to prevent dishing of the upper surface of the insulating layer filling the trench during polishing due to an excessively large width of the trench. Since the level difference due to dishing can be eliminated, precise patterning is allowed even on the trench.

In the semiconductor device according to a preferred aspect of the invention, the first and second insulating layers have the upper surfaces at the substantially same level, so that patterning of the conductive layer and others on the first and second insulating layers can be patterned easily.

In the semiconductor device according to another preferred aspect of the invention, the second insulating layer has a thickness from 2000 Å to 8000 Å. If the second insulating layer has a film thickness smaller than 2000 Å, it is difficult to reduce a parasitic capacitance between the conductive layer and the semiconductor substrate. If the second insulating layer has a thickness larger than 8000 Å, it is difficult to perform intended patterning of the conductive layer.

In the semiconductor device according to yet another preferable aspect of the invention, the trench has a width from 0.1 μm to 10 μm. If the trench width exceeds 10 μm, the upper surface of first insulating layer filling the trench is dished during polishing, which impedes patterning of the conductive layer and others at the dish portion thus formed. If the trench width is smaller than 0.1 μm, it is difficult to achieve an effect of electrical isolation.

According to the method of manufacturing the semiconductor device of the invention, it is possible to manufacture a semiconductor device, which can suppress the parasitic capacitance, can easily perform a fast operation and allow precise patterning on the trench.

The embodiments described hereinbefore are by way of illustration and example only and are not to be taken by way of limitation. The spirit and scope of the present invention being limited only by the terms of the appended claims.

What is claimed is:

1. A semiconductor device having an element isolating region for electrically isolating mutually neighboring element formation regions from each other, and comprising:

a semiconductor substrate having a main surface and provided at said main surface with in said element isolating region with a plurality of trenches;

a first insulating layer filling said trench and having a portion protruded above said main surface, said portion of said first insulating layer protruded above said main surface having a side surface substantially continuous with a side surface of said trench;

a second insulating layer formed entirely on said main surface located between said plurality of trenches, and made of a material different from that of said first insulating layer; and a conductive layer electrically connected to an element in said element formation region, having a portion located in said element formation region and formed on said main surface with a third insulating layer therebetween, and having a portion located in said element isolating region and extending over upper surfaces of said first and second insulating layers, said second insulating layer having a thickness larger than that of said third insulating layer.

2. The semiconductor device according to claim 1, wherein
   the upper surface of said first insulating layer is at the substantially same level as the upper surface of said second insulating layer from said main surface.

3. The semiconductor device according to claim 2, wherein
   the upper surface of said conductive layer in said element formation region is located at a first level from said main surface, and the upper surfaces of said first and second insulating layers are located at a second level not higher than said first level.

4. The semiconductor device according to claim 1, wherein
   said second insulating layer has a thickness from 2000 Å to 8000 Å.

5. The semiconductor device according to claim 1, wherein
   said first insulating layer is a silicon oxide film not substantially containing impurity, and said second insulating layer is a silicon oxide film containing at least either of boron or phosphorus.

6. The semiconductor device according to claim 1, wherein
   said first insulating layer has a silicon oxide film, and said second insulating layer has a silicon nitride film.

7. The semiconductor device according to claim 1, wherein
   said trench extends with its width kept in a range from 0.1 μm to 10 μm.

8. The semiconductor device according to claim 1, wherein
   said conductive layer is a gate electrode layer of an insulated gate field effect transistor, and said third insulating layer is a gate insulating layer.

9. The semiconductor device according to claim 8, wherein
   said element formation region having said insulated gate field effect transistor is surrounded by said element isolating region.

* * * * *